(12) United States Patent
Ryu

(10) Patent No.: US 7,074,643 B2
(45) Date of Patent: Jul. 11, 2006

(54) SILICON CARBIDE POWER DEVICES WITH SELF-ALIGNED SOURCE AND WELL REGIONS AND METHODS OF FABRICATING SAME

(75) Inventor: Sei-Hyung Ryu, Cary, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 10/422,130

(22) Filed: Apr. 24, 2003

(65) Prior Publication Data
US 2004/0211980 A1 Oct. 28, 2004

(51) Int. Cl.
H01L 21/00 (2006.01)

(52) U.S. Cl. ............... 438/105; 438/150; 438/305; 438/306; 438/519; 438/931

(58) Field of Classification Search ............... 438/105, 438/150, 151, 482, 483, 518, 519, 931; 257/77, 257/263, 266, 269, 303, 309, 351, 369, 383, 257/769
See application file for complete search history.

(56) References Cited

U.S. PATENT DOCUMENTS

| | | | | |
|---|---|---|---|---|
| 3,629,011 | A | 12/1971 | Tohi et al. ............ 148/1.5 |
| 3,924,024 | A | 12/1975 | Naber et al. ............ 427/95 |
| 4,466,172 | A | 8/1984 | Batra ............ 29/571 |
| 4,811,065 | A | 3/1989 | Cogan ............ 257/328 |
| 4,875,083 | A | 10/1989 | Palmour ............ 357/23.6 |
| 5,111,253 | A | 5/1992 | Korman et al. ............ 257/341 |
| 5,170,231 | A | 12/1992 | Fujii et al. ............ 257/77 |
| 5,170,455 | A | 12/1992 | Goossen et al. ............ 385/89 |
| 5,184,199 | A | 2/1993 | Fujii et al. ............ 29/10 |
| 5,270,554 | A | * 12/1993 | Palmour ............ 257/77 |
| 5,348,895 | A | 9/1994 | Smayling et al. ............ 437/54 |
| 5,384,270 | A | 1/1995 | Ueno ............ 437/40 |

(Continued)

FOREIGN PATENT DOCUMENTS

| | | |
|---|---|---|
| DE | 198 09 554 | 9/1998 |
| DE | 198 32 329 A1 | 2/1999 |
| DE | 19900171 | 12/2000 |
| DE | 10036208 | 2/2002 |

(Continued)

OTHER PUBLICATIONS

Palmour et al. "SiC Device Technology: Remaining Issues," Diamond and Related Materials. vol. 6, 1997, pp. 1400–1404.

Rao et al. "P–N Junction Formation in 6H–SiC by Acceptor Implantation into N–Type Substrate," Nuclear Instruments and Methods in Physics Research B. vol. 106, 1995, pp. 333–338.

(Continued)

Primary Examiner—Andy Huynh
(74) Attorney, Agent, or Firm—Myers Bigel Sibley & Sajovec

(57) ABSTRACT

Silicon carbide semiconductor devices and methods of fabricating silicon carbide semiconductor devices are provided by successively etching a mask layer to provide windows for formation of a source region or a first conductivity type, a buried silicon carbide region of a second conductivity type opposite to the first conductivity type and a second conductivity type well region in a first conductivity type silicon carbide layer. The source region and the buried silicon carbide region are formed utilizing a first window of the mask layer. Then, the well region is formed utilizing a second window of the mask layer, the second window being provided by a subsequent etch of the mask layer having the first window.

17 Claims, 15 Drawing Sheets

U.S. PATENT DOCUMENTS

| | | | | |
|---|---|---|---|---|
| 5,385,855 A | * | 1/1995 | Brown et al. | 438/238 |
| 5,393,999 A | | 2/1995 | Malhi | 257/289 |
| 5,396,085 A | * | 3/1995 | Baliga | 257/77 |
| 5,479,316 A | | 12/1995 | Smrtic et al. | 361/322 |
| 5,506,421 A | | 4/1996 | Palmour | 257/77 |
| 5,510,281 A | | 4/1996 | Ghezzo et al. | 437/41 |
| 5,510,630 A | | 4/1996 | Agarwal | 257/77 |
| 5,587,870 A | | 12/1996 | Anderson et al. | 361/313 |
| 5,629,531 A | * | 5/1997 | Palmour | 257/77 |
| 5,710,059 A | | 1/1998 | Rottner | 437/151 |
| 5,726,463 A | | 3/1998 | Brown et al. | 257/77 |
| 5,734,180 A | | 3/1998 | Malhi | 257/77 |
| 5,739,564 A | | 4/1998 | Kosa et al. | 257/298 |
| 5,763,905 A | | 6/1998 | Harris | 257/77 |
| 5,804,483 A | | 9/1998 | Harris | 438/268 |
| 5,814,859 A | | 9/1998 | Ghezzo et al. | 257/335 |
| 5,837,572 A | | 11/1998 | Gardner et al. | 438/199 |
| 5,851,908 A | | 12/1998 | Harris et al. | 438/520 |
| 5,877,041 A | | 3/1999 | Fuller | 438/105 |
| 5,877,045 A | | 3/1999 | Kapoor | 438/151 |
| 5,885,870 A | | 3/1999 | Maiti et al. | 438/261 |
| 5,917,203 A | | 6/1999 | Bhatnagar et al. | 257/139 |
| 5,939,763 A | | 8/1999 | Hao et al. | 257/411 |
| 5,960,289 A | | 9/1999 | Tsui et al. | 438/257 |
| 5,972,801 A | | 10/1999 | Lipkin et al. | 438/770 |
| 5,976,936 A | | 11/1999 | Miyajima et al. | 438/268 |
| 6,020,600 A | | 2/2000 | Miyajima et al. | 257/76 |
| 6,025,233 A | | 2/2000 | Terasawa | 438/270 |
| 6,025,608 A | | 2/2000 | Harris et al. | 257/77 |
| 6,028,012 A | | 2/2000 | Wang | |
| 6,048,766 A | | 4/2000 | Gardner et al. | |
| 6,054,352 A | | 4/2000 | Ueno | 438/268 |
| 6,063,698 A | | 5/2000 | Tseng et al. | |
| 6,096,607 A | | 8/2000 | Ueno | 438/522 |
| 6,100,169 A | * | 8/2000 | Suvorov et al. | 438/519 |
| 6,107,142 A | * | 8/2000 | Suvorov et al. | 438/285 |
| 6,117,735 A | | 9/2000 | Ueno | 438/268 |
| 6,133,587 A | | 10/2000 | Takeuchi et al. | 257/77 |
| 6,136,728 A | | 10/2000 | Wang | |
| 6,165,822 A | | 12/2000 | Okuno et al. | 438/142 |
| 6,180,958 B1 | | 1/2001 | Cooper, Jr. | 257/77 |
| 6,190,973 B1 | | 2/2001 | Berg et al. | 438/275 |
| 6,204,135 B1 | * | 3/2001 | Peters et al. | 438/301 |
| 6,204,203 B1 | | 3/2001 | Narwankar et al. | 438/785 |
| 6,211,035 B1 | | 4/2001 | Moise et al. | 438/396 |
| 6,221,700 B1 | | 4/2001 | Okuno et al. | 438/151 |
| 6,228,720 B1 | | 5/2001 | Kitabatake et al. | 438/268 |
| 6,238,967 B1 | | 5/2001 | Shiho et al. | 438/244 |
| 6,239,463 B1 | | 5/2001 | Williams et al. | 257/328 |
| 6,246,076 B1 | | 6/2001 | Lipkin et al. | 257/77 |
| 6,297,100 B1 | | 10/2001 | Kumar et al. | 438/268 |
| 6,297,172 B1 | | 10/2001 | Kashiwagi | 438/773 |
| 6,303,508 B1 | | 10/2001 | Alok | 438/705 |
| 6,316,791 B1 | | 11/2001 | Schorner et al. | 257/77 |
| 6,344,663 B1 | | 2/2002 | Slater, Jr. et al. | 257/77 |
| 6,399,996 B1 | | 6/2002 | Chang et al. | 257/484 |
| 6,420,225 B1 | | 7/2002 | Chang et al. | 438/237 |
| 6,429,041 B1 | | 8/2002 | Ryu et al. | 438/105 |
| 6,448,160 B1 | | 9/2002 | Chang et al. | 438/527 |
| 6,455,892 B1 | | 9/2002 | Okuno et al. | 257/77 |
| 6,551,865 B1 | * | 4/2003 | Kumar et al. | 438/137 |
| 6,573,534 B1 | * | 6/2003 | Kumar et al. | 257/77 |
| 6,593,620 B1 | | 7/2003 | Hshieh et al. | 257/335 |
| 6,610,366 B1 | | 8/2003 | Lipkin | 427/248 |
| 6,653,659 B1 | | 11/2003 | Ryu et al. | 257/77 |
| 2001/0055852 A1 | | 12/2001 | Moise et al. | 438/396 |
| 2002/0030191 A1 | | 3/2002 | Das et al. | 257/77 |
| 2002/0038891 A1 | * | 4/2002 | Ryu et al. | 257/350 |
| 2002/0047125 A1 | | 4/2002 | Fukuda et al. | 257/77 |
| 2002/0072247 A1 | | 6/2002 | Lipkin et al. | 438/767 |
| 2002/0102358 A1 | | 8/2002 | Das et al. | 472/376.2 |
| 2004/0212011 A1 | | 10/2004 | Ryu | 257/335 |

FOREIGN PATENT DOCUMENTS

| | | |
|---|---|---|
| EP | 0637069 B1 | 2/1995 |
| EP | 0637069 A1 | 2/1995 |
| EP | 1 058 317 A2 | 12/2000 |
| JP | 01117363 | 5/1989 |
| JP | 03034466 | 2/1991 |
| JP | 03157974 | 7/1991 |
| JP | 08264766 | 10/1996 |
| JP | 09205202 | 8/1997 |
| JP | 11191559 | 7/1999 |
| JP | 11238742 | 8/1999 |
| JP | 11261061 | 9/1999 |
| JP | 11266017 | 9/1999 |
| JP | 11274487 | 10/1999 |
| JP | 2000049167 | 2/2000 |
| JP | 2000082812 | 3/2000 |
| JP | 02000025246 | 9/2000 |
| JP | 20000106371 | 4/2001 |
| WO | WO 97/98754 | 3/1997 |
| WO | WO 97/17730 | 5/1997 |
| WO | WO 97/39485 | 10/1997 |
| WO | WO 98/02916 | 1/1998 |
| WO | WO 98/02924 | 1/1998 |
| WO | WO99/63591 | 12/1999 |
| WO | WO 00/13236 | 3/2000 |
| WO | WO 01/78134 A1 | 10/2001 |

OTHER PUBLICATIONS

Rao et al. "Al and N Ion Implantations in 6H–SiC," Silicon Carbide and Related Materials. 1995 Conf, Kyoto, Japan. Published 1996.

Capano, M.A., et al., Ionization Energies and Electron Mobilities in Phosphorus—and Nitrogen–Implanted 4H–Silicon Carbide, IEEE ICSCRM Conference 1999, Research Triangle Park, North Carolina (Oct. 10–13, 1999).

Patel, R., et al., Phosphorus–Implanted High–Voltage N.sup.+ P 4H–SiC Junction Rectifiers, Proceedings of 1998 International Symposium on Poer Semiconductor Devices & ICs, pp. 387–390 (Kyoto).

Dastidar, Sujoyita, A Study of P–Type Activation in Silicon Carbide, Thesis (Purdue University, May 1998).

Bhatnagar et al. "Comparison of 6H–SiC, 3C–SiC, and Si for Power Devices," *IEEE Transactions on Electron Devices*, vol. 40, No. 3, Mar. 1993, pp. 645–655.

Baliga, Power Semiconductor Devices, Chapter 7, PWS Publishing, 1996.

U.S. Appl. No. 60/435,212.

U.S. Appl. No. 60/294,307.

U.S. Appl. No. 10/422,130.

Mutin, P. Herbert, "Control of the Composition and Structure of Silicon Oxycarbide and Oxynitride Glasses Derived from Polysiloxane Precursors," *Journal of Sol–Gel Science and Technology*. vol. 14 (1999) pp. 27–38.

del Prado et al. "Full Composition Range Silicon Oxynitride Films Deposited by ECR–PECVD at Room Temperatures," *Thin Solid Films*. vol. 343–344 (1999) p. 437–440.

Kobayashi et al. "Dielectric Breakdown and Current Conduction of Oxide/Nitride/Oxide Multi–Layer Structures," *1990 IEEE Symposium on VLSI Technology*. pp. 119–120.

Ma et al. "Fixed and trapped charges at oxide–nitride–oxide heterostructure interfaces formed by remote plasma enhanced chemical vapor deposition," *J. Vac. Sci. Technol. B*. vol. 11, No. 4, Jul./Aug. 1993, pp. 1533–1540.

Dimitrijev et al., "Nitridation of Silicon–Dioxide Films Grown on 6H Silicon Carbide", *IEEE Electronic Device Letters*, vol. 18, No. 5, May 05, 1997, pp. 175–177.

De Meo et al., "Thermal Oxidation of SiC in $N_2O$", *J. Electrochem. Soc.*, vol. 141, 1994, pp. L150–L152.

Dahlquist et al. "A 2.8kV, Forward Drop JBS Diode with Low Leakage," *Materials Science Forum*, vol. 338–342, (2000) pp. 1179–1182.

Mondal et al. "An Integrated 500–V Power DSMOSFET/ Antiparallel Rectifier Device with Improved Diode Reverse Recovery Characteristics," *IEEE Electron Device Letters*, vol. 23, No. 9, Sep. 2002, pp. 562–564.

Motorola Power MOSFET Transistor Databook, 4th edition. Motorola, INc., 1989, pp. 2–5–4—2–5–7.

Ryu et al. Article and Presentation: "27 m$\Omega$–cm$^2$, 1.6kV Power DiMOSFETs in 4H–SiC," *Proceedings of the 14 International Symposium on Power Semiconductor Devices & ICs 2002*, Jun. 4–7, 2002, Santa Fe, NM.

Chung et al. "Effects of anneals in ammonia on the interface trap density near athe band edges in 4H–silicon carbide metal–oxide–semiconductor capacitors," *Applied Physics Letters*. vol. 77, Nov. 27, 2000, pp. 3601–3603.

Williams et al. "Passivation of the 4H–SiC/SiO$_2$ Interface with Nitric Oxide," *Materials Science Forum*. vol. 389–393 (2002), pp. 967–972.

A.K. Agarwal, J.B. Casady, L.B. Rowland, W.F. Valek, and C.D. Brandt, "1400 V 4H–SiC Power MOSFET's," Materials Science Forum vol. 264–268, pp. 989–992, 1998.

A.K. Agarwal, J.B. Casady, L.B. Rowland, W.F. Valek, M.H. White, and C.D. Brandt, "1.1 kV 4H–SiC Power UMOSFET's," *IEEE Electron Device Letters*, vol. 18, No. 12, pp. 586–588, Dec. 1997.

A.K. Agarwal, N.S. Saks, S.S. Mani, V.S. Hegde and P.A. Sanger, "Investigation of Lateral RESURF, 6H–SiC MOSFETs," *Materials Science Forum*, vol. 338–342, pp. 1307–1310, 2000.

A.K. Agarwal, S. Seshadri, and L.B. Rowland, "Temperature Dependence of Fowler–Nordheim Current in 6H–and 4H–SiC MOS Capacitors," *IEEE Electron Device Letters*, vol. 18, No. 12, Dec. 1997, pp. 592–594.

A.V. Suvorov, L.A. Lipkin, G.M Johnson, R. Singh and J.W. Palmour, "4H–SiC Self–Aligned Implant–Diffused Structure for Power DMOSFETs," *Materials Science Forum* vol. 338–342, pp. 1275–1278, 2000.

Agarwal et al. "A Critical Look at the Performance Advantages and Limitations of 4H–SiC Power UMOSFET Structures," *1996 IEEE ISPSD and IC's Proc.*, May 20–23, 1996, pp. 119–122.

Chakraborty et al. "Interface Properties of $N_2O$–annealed SiO$_2$/SiC system," *Proceedings IEEE Hong Kong Electron Devices Meeting*. Jun. 24, 2000, pp. 108–111.

Chang et al. "Observation of a Non-stoichiometric Layer at the Silicon Dioxide—Silicon Carbide Interface: Effect of Oxidation Temperature and Post–Oxidation Processing Conditions," *Mat. Res. Soc. Symp. Proc.* vol. 640, 2001.

Cho et al. "Improvement of charge trapping by hydrogen post–oxidation annealing in gate oxide of 4H–SiC methel–oxide–semiconductor capacitors," *Applied Physics Letters*. vol. 77, No. 8, pp. 1215–1217.

Chung et al., "The Effect of Si:C Source Ratio on SiO$_2$/SiC Interface State Density for Nitrogen Doped 4H and 6H–SiC," *Materials Science Forum*. (2000) vol. 338–342, pp. 1097–1100.

International Search Report for PCT/US01/30715.

International Search Report for PCT/US02/11691 dated Dec. 4, 2002.

International Search Report for PCT/US01/42414, dated Apr. 23, 2002.

D. Alok, E. Arnold, and R. Egloff, "Process Dependence of Inversion Layer Mobility in 4H–SiC Devices," *Materials Science Forum*, vol. 338–342, pp. 1077–1080, 2000.

Das, Mrinal K. Graduate thesis entitled, *Fundamental Studies of the Silicon Carbide MOS Structure*, Purdue University, 1999.

International Search Report dated Jul. 22, 2004 for corresponding International Application No. PCT/US2004/004982.

Fukuda et al. "Improvement of SiO$_2$/4H–SiC Interface Using High–Temperature Hydrogen Annealing at Low Pressure and Vacuum Annealing," *Jpn J. Appl. Phys.* vol. 38, Apr. 1999, pp. 2306–2309.

Fukuda et al. "Improvement of SiO$_2$/4H–SiC Interface by Using High Temperature Hydrogen Annealing at 1000° C," *Extended Abstracts of the International Conference on Solid State Devices and Materials*. Japan Society of Applied Physics, Tokyo, Japan, Sep. 1998.

G.Y. Chung, C.C. Tin, J.R. Williams, K. McDonald, M. Di Ventra, S.T. Pantelides, L.C. Feldman, and R.A. Weller, "Effect of nitric oxide annealing on the interface trap densities near the band edges in the 4H polytype of silicon carbide," *Applied Physics Letters*, vol. 76, No. 13, pp. 1713–1715, Mar. 2000.

G.Y. Chung, C.C. Tin, J.R. Williams, K. McDonald, R.K. Chanana, R.A. Weller, S.T. Pantelides, L.C. Feldman, O.W. Holland, M.K. Das, and J.W. Palmour, "Improved Inversion Channel Mobility for 4H–SiC MOSETs Following High Temperature Anneals in Nitric Oxide," *IEEE Electron Device Letters*, vol. 22, No. 4, Apr. 2001.

H.F. Li, S. Dimitrijev, H.B. Harrison, D. Sweatman, P.T. Tanner. "Improving SiO$_2$ Grown on P–Type 4H–SiC by NO Annealing," *Materials Science Forum*. vol. 264–268 (1998) pp. 869–872.

J. Tan, J.A. Cooper, Jr., and Mr. R. Melloch, "High–Voltage Accumulation–Layer UMOSFETs in 4H–SiC," *IEEE Electron Device Letters*, vol. 19, No. 12, pp. 487–489, Dec. 1998.

J.B. Casady, A.K. Agarwal, L.B. Rowland, W.F. Valek, and C.D. Brandt, "900 V DMOS and 1100 V UMOS 4H–SiC Power FETs," *IEEE Device Research Conference*, Ft. Collins, CO Jun. 23–25, 1997.

J.N. Shenoy, J.A. Cooper and M.R. Meelock, "High–Voltage Double–Implanted Power MOSFETs in 6H–SiC," *IEEE Electron Device Letters*, vol. 18, No. 3, pp. 93–95, Mar. 1997.

Jarnet et al. "Physical properties of $N_2O$ and NO–nitrided gate oxides grown on 4H SiC," *Applied Physics Letters*. vol. 79, No. 3, Jul. 16, 2001, pp. 323–325.

K. Ueno and Tadaaki Oikawa, "Counter–Doped MOSFET's of 4H–SiC," *IEEE Electron Device Letters*, vol. 20, No. 12, pp. 624–626, Dec. 1999.

K. Ueno, R. Asai, and T. Tsuji. "4H–SiC MOSFET's Utilizing the H2 Surface Cleaning Technique." *IEEE Electron Device Letters*, vol. 19, No. 7, Jul. 1998, pp. 244–246.

L.A. Lipkin and J.W. Palmour, "Low interface state density oxides on p–type SiC," Materials Science Forum vol. 264–268, pp. 853–856, 1998.

Lai et al., "Interface Properties of N₂O–Annealed NH₃–Treated 6H–SiC MOS Capacitor," *Proc. 1999 IEEE Hong Kong Electron Devices Meeting*, Jun. 26, 1999, pp. 46–49.

Leonhard et al. "Long term stability of gate–oxides on n– and p–type silicon carbide studied by charge injection techniques," *Materials Science Engineering*, vol. 46, No. 1–3, Apr. 1997, pp. 263–266.

Lipkin et al. "Insulator Investigation on SiC for Improved Reliability," *IEEE Transactions on Electron Devices*. vol. 46, No. 3, Mar. 1999, pp. 525–532.

Lipkin et al. "Challenges and State–of–the–Art Oxides in SiC," *Mat. Res. Soc. Symp. Proc.* vol. 640, 2001, pp. 27–29.

M. K. Das, L.A. Lipkin, J.W. Palmour, G.Y. Chung, J.R. Williams, K. McDonald, and L.C. Feldman, "High Mobility 4H–SiC Inversion Mode MOSFETs Using Thermally Grown, NO Annealed $SiO_2$," *IEEE Device Research Conference*, Denver, CO Jun. 19–21, 2000.

M.A. Capano, S. Ryu, J.A. Cooper, Jr., M.R. Melloch, K. Rottner, S. Karisson, N. Nordell, A. Powell, and D.E. Walker, Jr., "Surface Roughening in Ion Implanted 4H–Silicon Carbide," *Journal of Electronic Materials*, vol. 28, No. 3, pp. 214–218, Mar. 1999.

M.K. Das, J.A. Cooper, Jr., M.R. Melloch, and M.A. Capano, "Inversion Channel Mobility in 4H– and 6H–SiC MOSFETs," *IEEE Semiconductor Interface Specialists Conference*, San Diego, CA, Dec. 3–5, 1998.

P.J. Tobin, Y. Okada, S. A. Ajuria, V. Lakhotia, W.A. Feil, and R. I. Hedge, "Furnace formation of silicon oxynitride thin dielectrics in nitrous oxide ($N_2O$): The role of nitric oxide (NO)." *Journal of Applied Physics*. vol. 75, No. 3, Feb. 1, 1994, pp. 1811–1817.

P.M. Shenoy and B.J. Baliga, "The Planar of 6H–SiC ACCUFET: A New High–Voltage Power MOSFET Structure," *IEEE Electron Device Letters*, vol. 18, No. 12, pp. 589–591, Dec. 1997.

P.T. Lai, Supratic Chakraborty, C.L. Chan, and Y.C. Cheng, "Effects of nitridation and annealing on interface properties of thermally oxidized $SiO_2$/SiC metal–oxide–semiconductor system," *Applied Physics Letters*, vol. 76, No. 25, pp. 3744–3746, Jun. 2000.

Pantelides et al., "Atomic–Scale Engineering of the SiC–SiO2 Interface," *Materials Science Forum*. (2000) vol. 338–342, pp. 1133–1136.

R. Schörner, P. Friedrichs, D. Peters, H. Mitlehner, B. Weis, and D. Stephani, "Rugged Power MOSFETs in 6H–SiC with Blocking Capability up to 1800 V," *Materials Science Forum* vol. 338–342, pp. 1295–1298, 2000.

R. Schorner, P. Friedrichs, D. Peters, and D. Stephani, "Significantly Improved Performance of MOSFETs on Silicon Carbide Using the 15R–SiC Polytype," *IEEE Electron Device Letters*, vol. 20, No. 5, pp. 241–244, May 1999.

Ranbir Singh, Sei–Hyung Ryu and John W. Palmour, "High Temperature, High Current, 4H–SiC Accu–DMOSFET," *Materials Science Forum* vol. 338–342, pp. 1271–1274, 2000.

S. Sridevan and B. Jayant Baliga, "Lateral N–Channel Inversion Mode 4H–SiC MOSFET's," *IEEE Electron Device Letters*, vol. 19, No. 7, pp. 228–230, Jul. 1998.

S. Sridevan, P.K. McLarty, and B.J. Baliga, "On the Presence of Aluminum in Thermally Grown Oxides on 6H–Silicon Carbide," *IEEE Electron Device Letters*, vol. 17, No. 3, pp. 136–138, Mar. 1996.

S.T. Pantelides, "Atomic Scale Engineering of SiC Dielectric Interfaces," DARPA/MTO High Power and ONR Power Switching MURI Reviews, Rosslyn, VA, Aug. 10–12, 1999.

Suzuki et al. "Effect of Post–oxidation–annealing in Hydrogen on $SiO_2$/4H–SiC Interface," *Materials Science Forum*, vol. 338–342 (2000) 1073–6.

Sze, S.M. *Physics of Semiconductor Devices*, John Wiley & Sons, p. 383–390, 1981.

V.R. Vathulya and M.H. White, "Characterization of Channel Mobility on Implanted SiC to Determine Polytype Suitability for the Power DIMOS Structure," *Electronic Materials Conference*, Santa Barbara, CA, Jun. 30–Jul. 2, 1999.

V.R. Vathulya, H. Shang, and M.H. White, "A Novel 6H–SiC Power DMOSFET with Implanted P–Well Spacer," *IEEE Electronic Device Letters*, vol. 20, No. 7, JUl. 1999, pp. 354–356.

V.V. Afanasev, M. Bassler, G. Pensl, and M. Schulz, "Intrinsic SiC/$SiO_2$ Interface States," *Phy. Stat. Sol. (a)*, vol. 162, pp. 321–337, 1997.

Wang et al. "High Temperature Characteristics of High–Quality SiC MIS Capacitors with O/N/O Gate Dielectric," *IEEE Transactions on Electron Devices*. vol. 47, No. 2, Feb. 2000, pp. 458–462.

Xu et al. "Improved Performance and Reliability of $N_2O$–Grown Oxynitride on 6H–SiH," *IEEE Electron Device Letters*. vol. 21, No. 6, Jun. 2000, p. 298–300.

Y. Wang, C. Weitzel, and M. Bhatnagar, "Accumulation–Mode SiC Power MOSFET Design Issues," *Materials Science Forum*, vol. 338–342, pp. 1287–1290.

\* cited by examiner

SILICON CARBIDE POWER DEVICES WITH SELF-ALIGNED SOURCE AND WELL REGIONS AND METHODS OF FABRICATING SAME

FIELD OF THE INVENTION

This invention relates to methods of fabricating power devices, and more particularly to methods of fabricating silicon carbide power devices.

BACKGROUND OF THE INVENTION

Power devices are widely used to carry large currents and support high voltages. Modern power devices are generally fabricated from monocrystalline silicon semiconductor material. One widely used power device is the power Metal Oxide Semiconductor Field Effect Transistor (MOSFET). In a power MOSFET, a control signal is supplied to a gate electrode that is separated from the semiconductor surface by an intervening insulator, which may be, but is not limited to, silicon dioxide. Current conduction occurs via transport of majority carriers, without the presence of minority carrier injection that is used in bipolar transistor operation. Power MOSFETs can provide an excellent safe operating area, and can be paralleled in a unit cell structure.

As is well known to those having skill in the art, power MOSFETs may include a lateral structure or a vertical structure. In a lateral structure, the drain, gate and source terminals are on the same surface of a substrate. In contrast, in a vertical structure, the source and drain are on opposite surfaces of the substrate.

Recent development efforts in power devices have also included investigation of the use of silicon carbide (SiC) devices for power devices. Silicon carbide has a wide bandgap, a lower dielectric constant, a high breakdown field strength, a high thermal conductivity, and a high saturation electron drift velocity compared to silicon. These characteristics may allow silicon carbide power devices to operate at higher temperatures, higher power levels and/or with lower specific on-resistance than conventional silicon-based power devices. A theoretical analysis of the superiority of silicon carbide devices over silicon devices is found in a publication by Bhatnagar et al. entitled "*Comparison of 6H—SiC, 3C—SiC and Si for Power Devices*", IEEE Transactions on Electron Devices, Vol. 40, 1993, pp. 645–655. A power MOSFET fabricated in silicon carbide is described in U.S. Pat. No. 5,506,421 to Palmour entitled "Power MOSFET in Silicon Carbide" and assigned to the assignee of the present invention.

A number of silicon carbide power MOSFET structures have been described in the literature. See e.g. U.S. Pat. No. 5,506,421; A. K. Agarwal, J. B. Casady, L. B. Rowland, W. F. Valek, M. H. White, and C. D. Brandt, "1.1 kV 4H—SiC Power UMOSFET's," IEEE Electron Device Letters, Vol. 18, No. 12, pp. 586–588, December 1997; A. K. Agarwal, J. B. Casady, L. B. Rowland, W. F. Valek and C. D. Brandt, "1400 V 4H—SiC Power MOSFETs," Materials Science Forum Vols. 264–268, pp. 989–992, 1998; J. Tan, J. A. Cooper, Jr., and M. R. Melloch, "High-Voltage Accumulation-Layer UMOSFETs in 4H—SiC," IEEE Electron Device Letters, Vol. 19, No. 12, pp. 487–489, December 1998; J. N. Shenoy, J. A. Cooper and M. R. Melloch, "High-Voltage Double-Implanted Power MOSFET's in 6H—SiC," IEEE Electron Device Letters, Vol. 18, No. 3, pp. 93–95, March 1997; J. B. Casady, A. K. Agarwal, L. B. Rowland, W. F. Valek, and C. D. Brandt, "900 V DMOS and 1100 V UMOS 4H—SiC Power FETs," IEEE Device Research Conference, Ft. Collins, Colo., June 23–25, 1997; R. Schörner, P Friedrichs, D. Peters, H. Mitlehner, B. Weis and D. Stephani, "Rugged Power MOSFETs in 6H—SiC with Blocking Capability up to 1800 V," Materials Science Forum Vols. 338–342, pp. 1295–1298, 2000; V. R. Vathulya and M. H. White, "Characterization of Channel Mobility on Implanted SiC to determine Polytype suitability for the Power DIMOS structure," Electronic Materials Conference, Santa Barbara, Calif., Jun. 30–Jul. 2, 1999; A. V. Suvorov, L. A. Lipkin, G. M. Johnson, R. Singh and J. W. Palmour, "4H—SiC Self-Aligned Implant-Diffused Structure for Power DMOSFETs," Materials Science Forum Vols. 338–342, pp. 1275–1278,2000; P. M. Shenoy and B. J. Baliga, "The Planar 6H—SiC ACCUFET: A New High-Voltage Power MOSFET Structure," IEEE Electron Device Letters, Vol. 18, No. 12, pp. 589–591, December 1997; Ranbir Singh, Sei-Hyung Ryu and John W. Palmour, "High Temperature, High Current, 4H—SiC Accu-DMOSFET," Materials Science Forum Vols. 338–342, pp. 1271–1274, 2000; Y. Wang, C. Weitzel and M. Bhatnagar, "Accumulation-Mode SiC Power MOSFET Design Issues," Materials Science Forum Vols. 338–342, pp. 1287–1290, 2000; A. K. Agarwal, N. S. Saks, S. S. Mani, V. S. Hegde and P. A. Sanger, "Investigation of Lateral RESURF, 6H—SiC MOSFETs," Materials Science Forum Vols. 338–342, pp. 1307–1310, 2000; and Shenoy et al., "High-Voltage Double-Implanted Power MOSFET's in 6H—SiC," IEEE Electron Device Letters, Vol. 18, No. 3, March 1997, pp. 93–95.

One widely used silicon power MOSFET is the double diffused MOSFET (DMOSFET) that is fabricated using a double-diffusion process. A conventional DMOSFET 510 in silicon is illustrated in FIG. 1. In these devices, a p-base region 514 and an n$^+$ source region 516 are diffused in a substrate 512 through a common opening in a mask. The p-base region 514 is driven in deeper than the n$^+$ source region 516. The difference in the lateral diffusion between the p-base 514 and 11$^+$ source regions 16 forms a surface channel region. A gate oxide 518 is provided on the substrate 512 and a gate contact 520 on the gate oxide 518. A source contact 522 is provided on the substrate 512 between the n$^+$ source regions 516. A drain contact 524 is provided on the substrate 512 opposite the source contact 522. An overview of power MOSFETs including DMOSFETs may be found in the textbook entitled "*Power Semiconductor Devices*" by B. J. Baliga, published by PWS Publishing Company, 1996, and specifically in Chapter 7, entitled "Power MOSFET", the disclosure of which is hereby incorporated herein by reference. The DMOSFET structure has also been fabricated in silicon carbide, however, because of the low diffusion of dopants in silicon carbide, other techniques, such as double implants, have been used in fabricating DMOSFETs in silicon carbide. Thus, the term "DMOSFET" is used herein to refer to a structure similar to that of FIG. 1 having a base or well region and source regions in the base or well region irrespective of the methods used in fabricating the structure.

Notwithstanding the potential advantages of silicon carbide, it may be difficult to fabricate power devices including power MOSFETs in silicon carbide. For example, as described above, the DMOSFET is generally fabricated in silicon using a double diffusion process wherein the p-base region is driven in deeper than the n+source. Unfortunately, in silicon carbide, the diffusion coefficients of conventional p-type and n-type dopants are small compared to silicon, so that it may be difficult to obtain the required depths of the p-base and n$^+$ source regions using acceptable diffusion times and temperatures. Ion implantation may also be used to implant the p-base and the n$^+$ source. See, for example, "*High-Voltage Double-Implanted Power* MOSFET's in *6H—SiC*" by Shenoy et al., IEEE Electron Device Letters, Vol. 18, No. 3, March 1997, pp. 93–95.

SUMMARY OF THE INVENTION

Embodiments of the present invention provide silicon carbide semiconductor devices and methods of fabricating silicon carbide semiconductor devices by successively patterning, for example, by etching, a mask layer to provide windows for formation of a source region of a first conductivity type, a buried silicon carbide region of a second conductivity type opposite to the first conductivity type and a second conductivity type well region in a first conductivity type silicon carbide layer. The source region and the buried silicon carbide region are formed utilizing a first window of the mask layer. Then, the well region is formed utilizing a second window of the mask layer, the second window being provided by a subsequent widening of the first window.

In particular embodiments of the present invention, the first conductivity type is n-type silicon carbide and the second conductivity type is p-type silicon carbide. In such embodiments, the buried silicon carbide region is a buried p-type silicon carbide region and the well region is a p-well region.

In further embodiments of the present invention, successively patterning a mask layer, forming the source region and the buried p-type silicon carbide region and forming the p-well region are provided by forming the mask layer on a first surface of the first n-type silicon carbide layer and patterning the mask layer to provide a first implantation mask, the first implantation mask having at least one window corresponding to the source region of the silicon carbide power device. Then, n-type dopants are implanted in the first n-type silicon carbide layer utilizing the first implantation mask to provide an n-type source region. The n-type source region extends to the first surface of the first n-type silicon carbide layer and has a higher carrier concentration than the first n-type silicon carbide layer. P-type dopants are also implanted in the first n-type silicon carbide layer utilizing the first implantation mask to provide the buried p-type region adjacent the n-type source region. The buried p-type region is disposed at a depth in the first n-type silicon carbide layer greater than a depth of the n-type source region. The first implantation mask is then enlarged, for example, by isotropically etching, to provide a second implantation mask. The second implantation mask has at least one window corresponding to the p-well region and corresponding to the at least one window of the first implantation mask widened. P-type dopants are then implanted in the first n-type silicon carbide layer utilizing the second implantation mask to provide the p-well region, the p-well region extending to the p-type buried region.

In additional embodiments of the present invention, a mask layer is successively patterned to provide windows for formation of a source region, a buried p-type silicon carbide region, a p-well region and a threshold adjustment region in a first n-type silicon carbide layer. In such embodiments, the threshold adjustment region is formed utilizing a third window of the mask layer, the third window being provided by a subsequent enlargement of the second window of the mask layer.

In yet other embodiments of the present invention, successively etching a mask layer, forming the source region and the buried p-type silicon carbide region and forming the p-well region are provided by forming the mask layer on a first n-type silicon carbide layer and patterning the mask layer to provide a first implantation mask. The first implantation mask-has at least one window corresponding to the source region of the silicon carbide power device. N-type dopants are then implanted in the first n-type silicon carbide layer utilizing the first implantation mask to provide an n-type source region. The n-type source region extends to a first surface of the first n-type silicon carbide layer and has a higher carrier concentration than the first n-type silicon carbide layer. P-type dopants are also implanted in the first n-type silicon carbide layer utilizing the first implantation mask to provide the buried p-type region adjacent the n-type source region. The p-type dopants are implanted utilizing a higher implantation energy than an implant energy utilized to implant the n-type dopants in the first n-type silicon carbide layer. The first window of the first implantation mask is then enlarged, for example, by isotropically etching, to provide a second implantation mask. The second implantation mask has at least one window corresponding to the p-well region and corresponding to the at least one window of the first implantation mask widened. P-type dopants are implanted in the first n-type silicon carbide layer utilizing the second implantation mask to provide the p-well region. The p-type dopants are implanted utilizing an implantation energy such that the p-well region extends to the p-type buried region.

In further embodiments, implanting p-type dopants in the first n-type silicon carbide layer utilizing the second implantation mask to provide the p-well region is provided by implanting p-type dopants in the first n-type silicon carbide layer utilizing the second implantation mask to provide a carrier concentration of the p-well region that is less than a carrier concentration of the buried p-type silicon carbide layer.

In additional embodiments of the present invention, implanting p-type dopants in the first n-type silicon carbide layer utilizing the second implantation mask to provide the p-well region is followed by enlarging the at leas one window of the second implantation mask, for example, by isotropically etching the second implantation mask, to provide a third implantation mask. The third implantation mask has at least one window corresponding to a threshold adjustment region and corresponding to the at least one window of the second implantation mask widened. N-type dopants are then implanted in the first n-type silicon carbide layer utilizing the third implantation mask to provide the threshold adjustment region. Furthermore, implanting n-type dopants in the first n-type silicon carbide layer utilizing the third implantation mask to provide the threshold adjustment region may be provided by implanting n-type dopants in the first n-type silicon carbide layer utilizing the third implantation mask to a depth of from about 0.1 µm to about 0.5 µm into the first n-type silicon carbide layer.

Additionally, the third implantation mask may be removed and a fourth implantation mask formed. The fourth implantation mask is patterned to provide a window exposing the first surface of the first n-type silicon carbide layer adjacent the source region. P-type dopants are implanted utilizing the fourth implantation mask to provide a p-type silicon carbide plug region. The plug region extends into the first n-type silicon carbide layer to contact the p-type buried region. A gate oxide is formed on the first surface of the first n-type silicon carbide layer. A gate contact is formed on the gate oxide. A source contact is formed on the source region and the plug region and a drain contact is formed on the first n-type silicon carbide layer opposite the first surface. A second n-type silicon carbide layer may also be formed on a surface of the first n-type silicon carbide layer opposite the first surface. The second n-type silicon carbide layer has a carrier concentration higher than a carrier concentration of the first n-type silicon carbide layer.

In still further embodiments of the present invention, implanting n-type dopants in the first n-type silicon carbide layer utilizing the third implantation mask to provide the threshold adjustment region is followed by removing the third implantation mask and forming an n-type silicon carbide epitaxial layer on the first surface of the first n-type silicon carbide layer. In such embodiments, forming an n-type silicon carbide epitaxial layer may be preceded by forming a fourth implantation mask, the fourth implantation mask patterned to provide a window exposing a portion of the n-type silicon carbide epitaxial layer adjacent the source region, implanting p-type dopants utilizing the fourth implantation mask to provide a p-type silicon carbide plug region, the plug region extending into the first n-type silicon carbide layer to contact the p-type buried region and activating the implanted dopants. Forming an n-type silicon carbide epitaxial layer may be followed by forming a gate oxide on n-type silicon carbide epitaxial layer, forming a gate contact on the gate oxide, forming a source contact on the source region and the plug region and foiling a drain contact on the first n-type silicon carbide layer opposite the first surface.

In particular embodiments of the present invention, implanting p-type dopants in the first n-type silicon carbide layer utilizing the second implantation mask to provide the p-well region is followed by removing the second implantation mask and forming an n-type silicon carbide epitaxial layer on the first surface of the first n-type silicon carbide layer. In such embodiments, forming an n-type silicon carbide epitaxial layer may be preceded by forming a third implantation mask, the third implantation mask patterned to provide a window exposing a portion of the n-type silicon carbide epitaxial layer adjacent the source region, implanting p-type dopants utilizing the third implantation mask to provide a p-type silicon carbide plug region, the plug region extending into the first n-type silicon carbide layer to contact the p-type buried region and activating the implanted dopants. Forming an n-type silicon carbide epitaxial layer may be followed forming a gate oxide on n-type silicon carbide epitaxial layer, forming a gate contact on the gate oxide, forming a source contact on the source region and the plug region and forming a drain contact on the first n-type silicon carbide layer opposite the first surface. A second n-type silicon carbide layer may also be formed on a surface of the first n-type silicon carbide layer opposite the first surface, the second n-type silicon carbide layer having a carrier concentration higher than a carrier concentration of the first n-type silicon carbide layer.

In other embodiments of the present invention, a silicon carbide power semiconductor device includes a first silicon carbide layer having a first conductivity type and a source region in the first silicon carbide layer and having the first conductivity type. The source region has a higher carrier concentration than a carrier concentration of the first silicon carbide layer and extending to a first surface of the first silicon carbide layer. A buried region of silicon carbide of the second conductivity type is provided in the first silicon carbide layer adjacent a bottom portion of the source region and at a depth in the first silicon carbide layer greater than a depth of the source region. A well region of silicon carbide of the second conductivity type is provided in the first silicon carbide layer adjacent an outside portion of the source region and extends toward the first surface of the first silicon carbide layer. The well region has a lower carrier concentration than a carrier concentration of the buried region. A plug region of silicon carbide of the second conductivity type is provided adjacent an inside portion of the source region opposite the well region and extends to the first face of the first silicon carbide layer. A gate oxide is on the first silicon carbide layer, the well region and the source region and a gate contact is on the gate oxide. A source contact is on the plug region and the source region and a drain contact is on the first silicon carbide layer opposite the first surface of the first silicon carbide layer.

In additional embodiments of the present invention, a silicon carbide power semiconductor device includes a first silicon carbide layer having a first conductivity type and a source region in the first silicon carbide layer and having the first conductivity type. The source region has a higher carrier concentration than a carrier concentration of the first silicon carbide layer and extending to a first surface of the first silicon carbide layer, the source region having dopants of the first conductivity type and dopants of a second conductivity type opposite the first conductivity type. A buried region of silicon carbide of the second conductivity type is provided in the first silicon carbide layer adjacent a bottom portion of the source region and at a depth in the first silicon carbide layer greater than a depth of the source region. A well region of silicon carbide of the second conductivity type is provided in the first silicon carbide layer adjacent an outside portion of the source region and extends toward the first surface of the first silicon carbide layer. A plug region of silicon carbide of the second conductivity type is adjacent an inside portion of the source region opposite the well region and extends to the first face of the first silicon carbide layer.

A gate oxide is on the first silicon carbide layer, the well region and the source region and a gate contact is on the gate oxide. A source contact is on the plug region and the source region and a drain contact is on the first silicon carbide layer opposite the first surface of the first silicon carbide layer.

In particular embodiments of the the silicon carbide power semiconductor device according to the present invention, the source region has dopants of the first conductivity type and dopants of a second conductivity type opposite the first conductivity type. Furthermore, the first conductivity type may be n-type and the second conductivity type may be p-type.

In additional embodiments of the present invention, threshold adjustment regions of first conductivity type silicon carbide are provided in the first silicon carbide layer and extend from the source region. The threshold adjustment regions are disposed between the well region and the first face of the first layer of silicon carbide. The threshold adjustment regions may extend to a depth of from about 0.01 μm to about 0.5 μm into the first layer of silicon carbide and may have a carrier concentration of from about $10^{15}$ to about $10^{19}$ cm$^{-3}$.

In further embodiments of the present invention, a first silicon carbide epitaxial layer may also be provided on the first face of the first silicon carbide layer between the gate oxide and the first silicon carbide epitaxial layer. The first silicon carbide epitaxial layer may have a thickness of from about 0.05 μm to about 1 μm and a carrier concentration of from about $10^{15}$ to about $10^{17}$ cm$^{-3}$. If both threshold adjustment regions and the fist epitaxial layer are provided, the threshold adjustment regions may extend to a depth of from about 0.01 μm to about 0.5 μm into the first layer of silicon carbide and have a carrier concentration of from about $10^{15}$ to about $10^{19}$ cm$^{-3}$ and the first silicon carbide epitaxial layer may have a thickness of from about 0.05 μm to about 1 μm and a carrier concentration of from about $10^{14}$ to about $10^{16}$ cm$^{-3}$.

In additional embodiments of the present invention, a second layer of silicon carbide of the first conductivity type is disposed between the first layer of silicon carbide and the drain contact. The second layer of silicon carbide has a higher carrier concentration than the first layer of silicon carbide. Furthermore, the second semiconductor layer may be a silicon carbide substrate and the first semiconductor layer may be an epitaxial layer on the silicon carbide substrate.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. As illustrated in the Figures, the sizes of layers or regions are exaggerated for illustrative purposes and, thus, are provided to illustrate the general structures of the present invention. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present. Furthermore, as used herein, an n$^+$ or p$^+$ layer or region refers to a layer or region having a higher carrier concentration than an adjacent or other n-type or p-type layer or region, whereas an n$^-$ or p$^-$ layer or region refers to a layer or region having a lower carrier concentration than an adjacent or other n-type or p-type layer or region.

Figure 1:
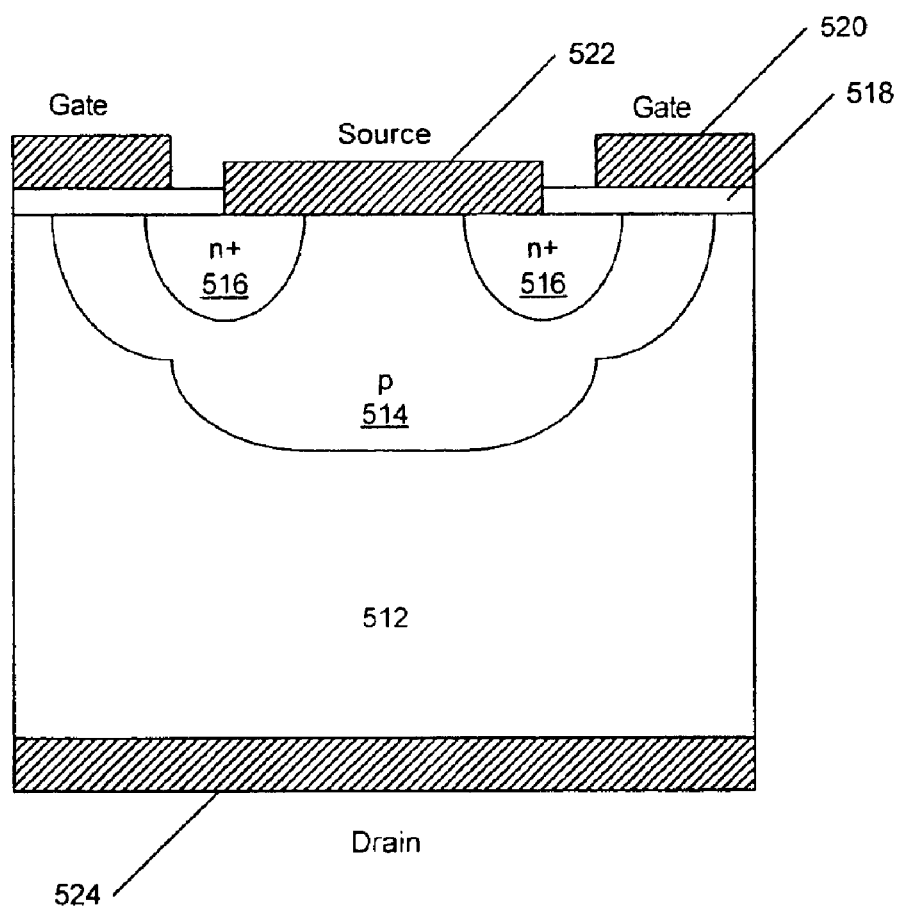
FIG. 1 is a cross-sectional view of a conventional DMOSFET.
Figure 2A:
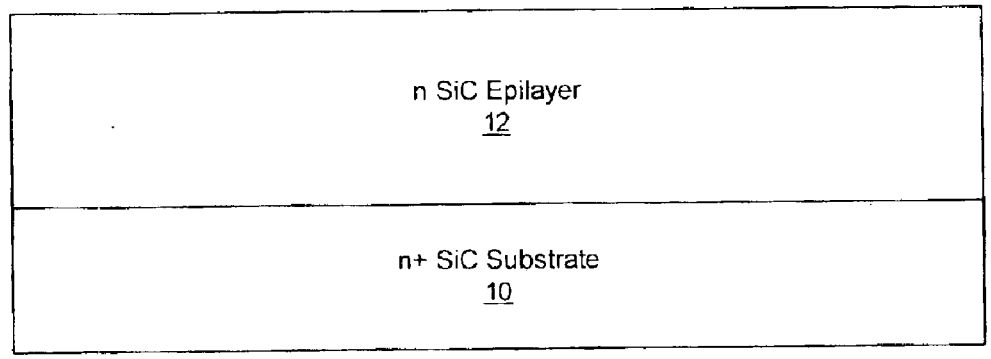
FIGS. 2A–2M are cross-sectional views of illustrating methods of fabrication of MOSFETs according to embodiments of the present invention.

Referring now to FIGS. 2A–2M, methods of fabricating a silicon carbide power MOSFET according to the present invention will now be described. As seen in FIG. 2A, a first n-type silicon carbide layer 12, such as an n$^-$ SiC epitaxial layer, is provided on a second n-type silicon carbide layer 10, for example, an n$^+$ SiC substrate. Alternatively, the first n-type silicon carbide layer 12 may be an n-type SiC substrate and the second n-type silicon carbide layer 10 may be an implanted or epitaxial layer. Methods of forming SiC substrates and epitaxial layers are known to those of skill in the art and, therefore, will not be described further herein. In particular embodiments of the present invention, the first n-type silicon carbide layer 12 is doped to provide a carrier concentration of from about $10^{14}$ to about $5 \times 10^{16}$ cm$^{-3}$ and may have a thickness of from about 6 to about 200 μm. The second n-type silicon carbide layer may be a SiC substrate such as those provided by Cree, Inc., Durham, N.C.

Figure 2B:
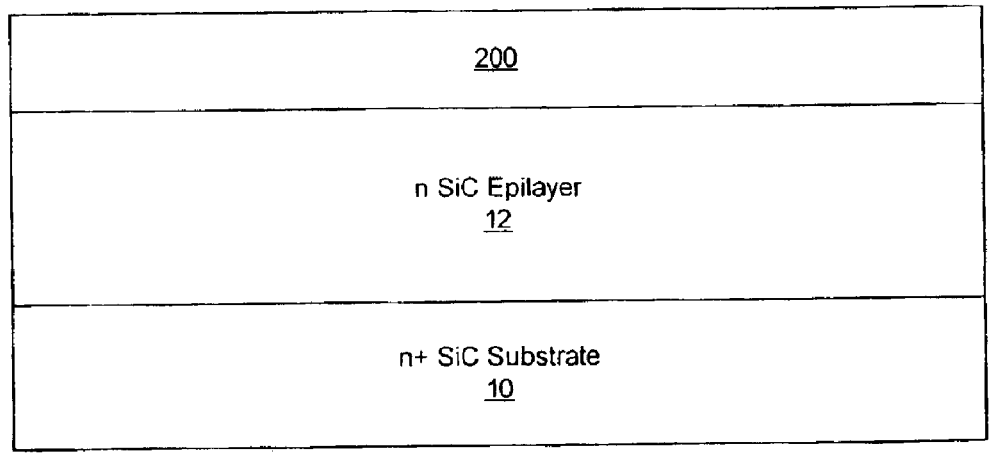

As seen in FIG. 2B, a mask layer 200 is formed on the first n-type silicon carbide layer 12. The mask layer 200 may be an oxide layer, such as a silicon dioxide layer and may be provided by deposition or thermal oxidation. The mask layer 200 may be thick enough so as to provide the successive masks described herein. In particular embodiments of the present invention, the mask layer 200 may be from about 1.5 to about 4 μm thick.

Figure 2C:
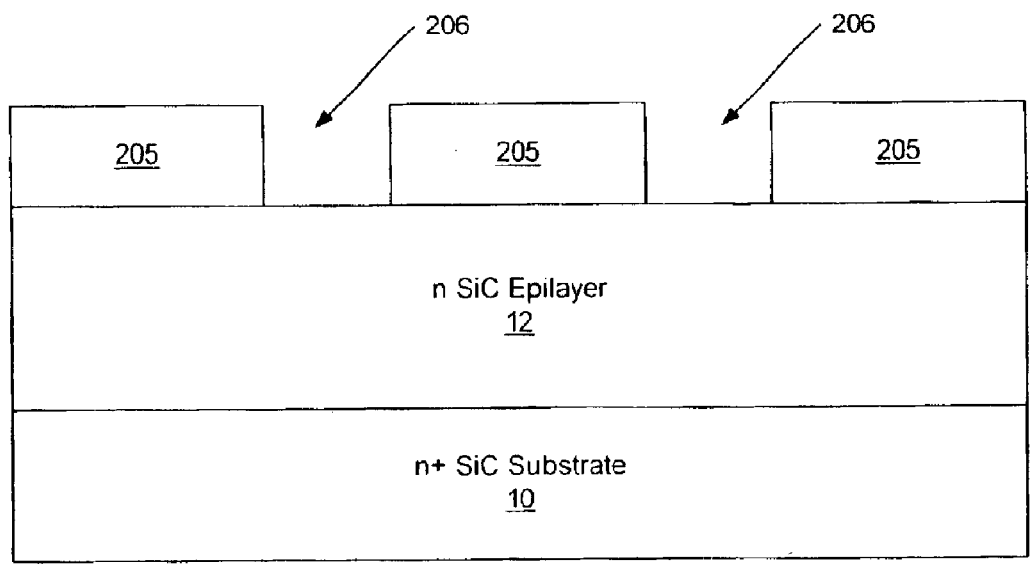
Figure 2D:
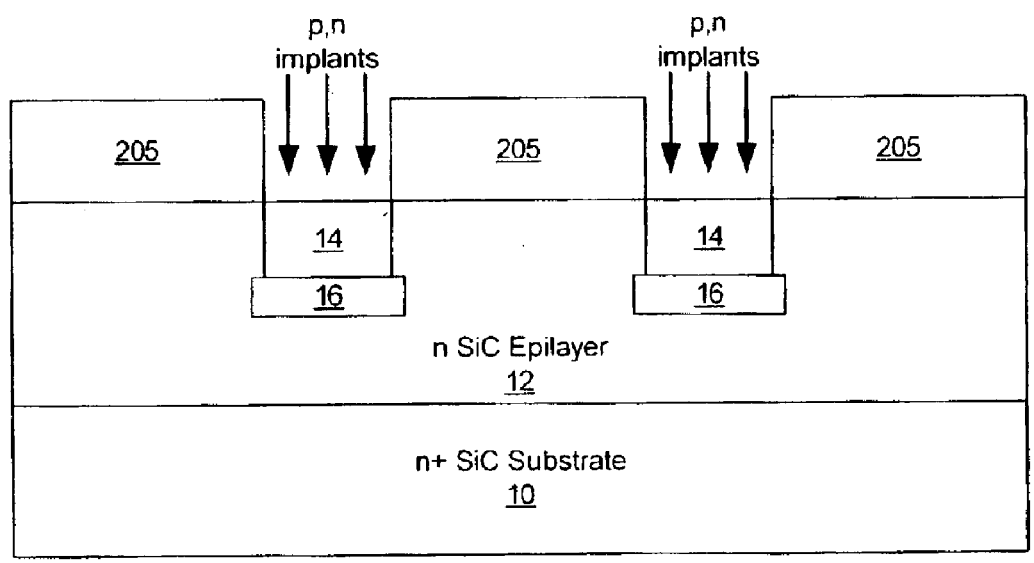

As seen in FIG. 2C, the mask layer 200 is patterned to provide a first mask 205. The first mask 205 may be formed by etching the mask layer 200 to open a window 206 to the first n-type silicon carbide layer 12. The window 206 defines a source region(s) of a MOSFET according to embodiments of the present invention. Implants of n-type and p-type dopants are performed through the window 206 of the first mask 205 as illustrated in FIG. 2D. In certain embodiments of the present invention, the window 206 is from about 0.5 μm to about 10 μm wide and corresponding portions of the window 206 are spaced apart by from about 1 μm to about 10 μm.

The n-type dopants are implanted to provide an n⁺ source region 14. Suitable dopants include, for example, nitrogen and phosphorous. In certain embodiments, the n-type dopants are implanted to provide a carrier concentration of about $5 \times 10^{19}$ cm$^{-3}$. The n-type dopants may be implanted with one or more implant energies of from about 10 to about 360 keV so as to provide the n⁺ source region 14 that extends from a first surface of the first n-type silicon carbide layer 12 to a depth of from about 0.1 μm to about 0.5 μm into the first n-type silicon carbide layer 12. In certain embodiments of the present invention, the n-type implant is carried out at room temperature, however, higher temperatures may also be utilized. The n⁺ source region 14 may be slightly wider than the window 206 as a result of implantation lateral straggle. Thus, for example, the n⁺ source region 14 may be from about 1 μm to about 12 μm wide and have thickness of from about 0.1 μm to about 0.5 μm.

The p-type dopants are implanted to provide a first buried p-region 16. Suitable dopants include, for example, Aluminum and Boron. In certain embodiments, the p-type dopants are implanted to provide a carrier concentration of about $10^{19}$ cm$^{-3}$ or greater. The p-type dopants may be implanted with an implant energy of from about 180 to about 360 keV so as to provide the first buried p-region 16 at a depth of from about 0.5 μm to about 1.2 μm into the first n-type silicon carbide layer 12. In certain embodiments of the present invention, the p-type implant is carried out at room temperature, however, higher temperatures may also be utilized. The first buried p-region 16 may be slightly wider than the window 206 and the n⁺ source region 14 as a result of greater implantation lateral straggle resulting from the use of higher implant energies. Thus, for example, the first buried p-region 16 may be from about 0.1 to about 0.2 μm wider than the n⁺ source region 14 and have an overall width of from about 1.2 μm to about 12.2 μm and a thickness of from about 0.5 μm to about 1.2 μm. In additional embodiments of the present invention, the p-type dopants are implanted prior to implanting the n-type dopants.

Figure 2E:
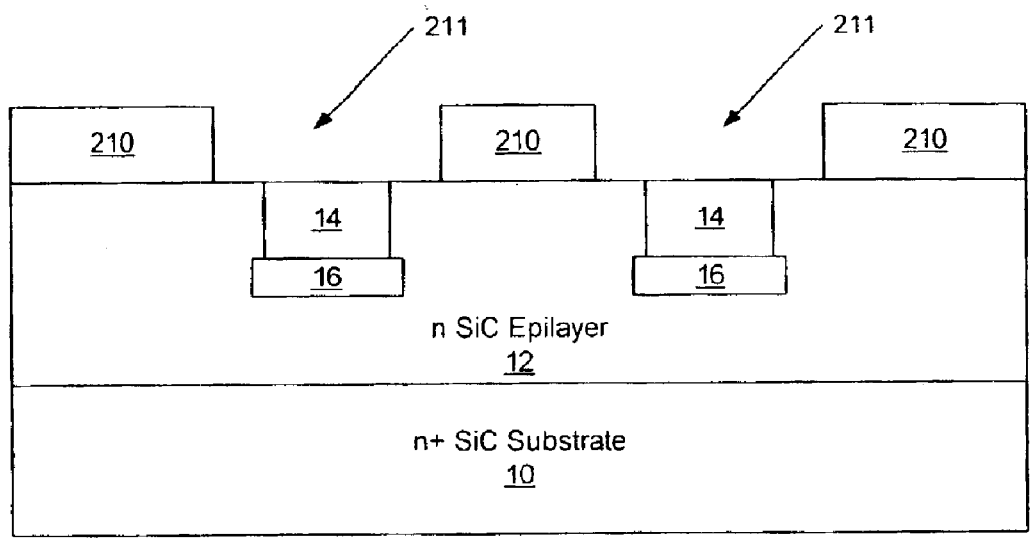
Figure 2F:
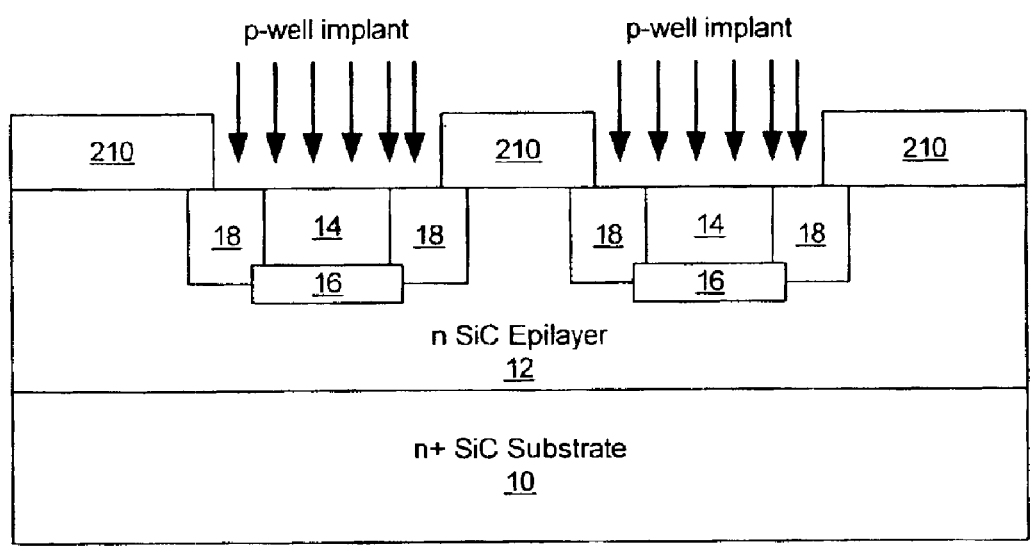

As seen in FIG. 2E, the window 206 is enlarged to provide the window 211. For example, an isotropic etch, such as a buffered HF etch, may be performed on the first mask 205 to widen the window 206 and provide a second implant mask 210 having tie window 211. Other techniques for widening the window 206, such as dry etching techniques, may also be used. In certain embodiments of the present invention, the etch of the first mask 205 provides a window 211 that is from about 0.5 to about 1.5 μm wider on each side than the window 206. Thus, the etch of the first mask 205 may remove from about 0.5 to about 1.5 μm of the first mask 205 to provide the second mask 210. The second mask 210 may have a resulting thickness of at least about 1.2 μm. The window 211 defines a p-well region(s) 18 of a MOSFET according to embodiments of the present invention. An implant of p-type dopants is performed through the window 211 of the second mask 210 as illustrated in FIG. 2F. Thus, the buried p-region 16, the source region 14 and the p-well region 18 are self aligned through the use of a single mask layer that is etched to provide a second implantation window. Furthermore, the MOS gate length is defined by the n⁺ source implant and the p-well implant. Thus, the MOS gate length of the device will be determined by the lateral etch and any implantation straggle of the p-type implant to form the p-well region 18.

As seen in FIG. 2F, p-type dopants are implanted to provide a p-well region 18. Suitable dopants include, for example, Aluminum and Boron. In certain embodiments, the p-type dopants are implanted to provide a carrier concentration of from about $10^{16}$ to about $10^{17}$ cm$^{-3}$. The concentration of p-type dopants may be uniform or non-uniform with depth. For example, in certain embodiments of the present invention, the concentration of p-type dopants in the p-well region 18 increases with depth. Furthermore, the concentration of p-type dopants should be sufficiently small so as to not significantly alter the conductivity of the n⁺ source region 14. Thus, the n⁺ source region 14 will have both p-type and n-type impurities implanted therein, however, the n-type impurities will dominate the conductivity of the n⁺ source region 14.

The p-type dopants may be implanted with one or more implant energies ranging from about 30 to about 360 keV so as to provide the p-well region 18 from the first surface of the first n-type silicon carbide layer 12 to a depth of from about 0.5 μm to about 1.2 μm into the first n-type silicon carbide layer 12. In certain embodiments of the present invention, the p-type implant is carried out at room temperature, however, higher temperatures may also be utilized. As mentioned above, the p-well region 18 may be slightly wider than the window 211 as a result of implantation lateral straggle resulting from the use of higher implant energies. Thus, for example, the p-well region 18 may extend from about 0.2 to about 0.3 μm past the edge of the window 211 and have an overall width of from about 0.7 to about 1.8 μm.

Figure 2G:
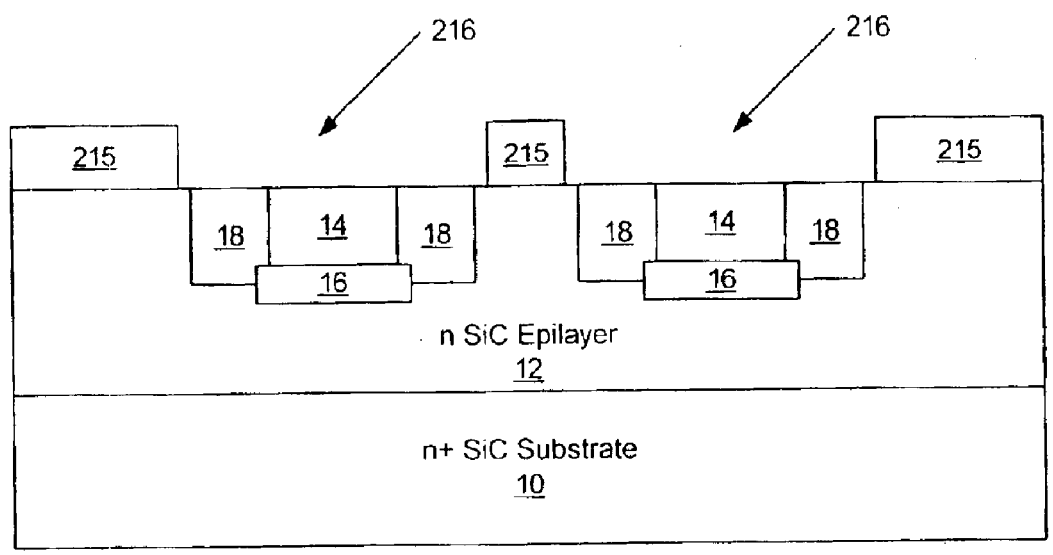
Figure 2H:
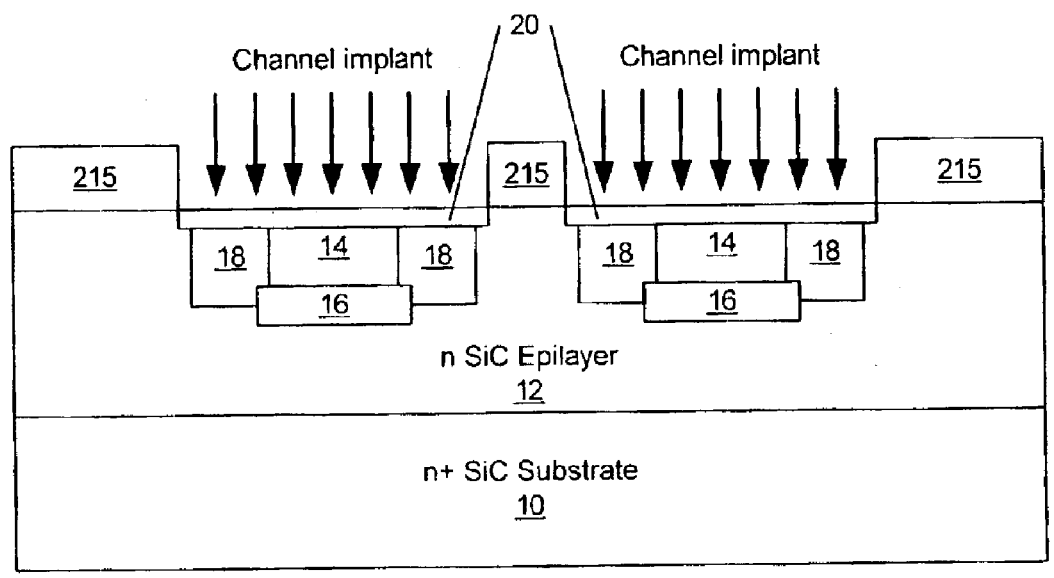
Figure 2I:
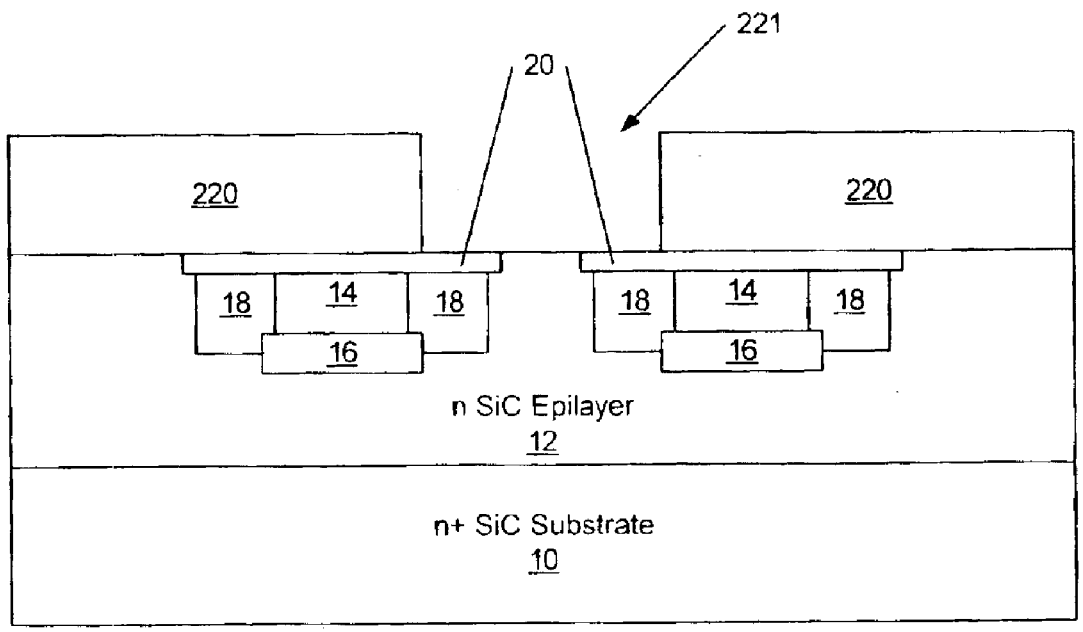

As seen in FIG. 2G, the window 211 is enlarged to provide the window 216. For example, a second isotropic etch, such as a second buffered HF etch, is performed on the first mask 210 to widen the window 211 and provide a third implant mask 215 having the window 216. In certain embodiments of the present invention, the etch of the second mask 210 provides a window 216 that is from about 0.3 to about 0.5 μm wider on each side than the window 211. Thus, the etch of the second mask 211 may remove from about 0.3 to about 0.5 μm of the second mask 210 to provide the third mask 215. The third mask 215 may have a resulting thickness of at least about 0.6 μm. The window 216 defines a threshold adjustment region(s) 20 of a MOSFET according to embodiments of the present invention. An implant of n-type dopants is performed through the window 216 of the third mask 215 as illustrated in FIG. 2H. Thus, the buried p-region 16, the source region 14, the p-well region 18 and the channel threshold adjustment region 20 are self aligned through the use of a single mask layer that is etched to provide a first implantation window that is subsequently etched to provide a second implantation window that is also subsequently etched to provide a third implantation window.

FIG. 2H illustrates the implantation of n-type dopants (the channel implant) to provide the threshold adjustment region 20. Suitable n-type dopants include, for example, nitrogen and phosphorous. In certain embodiments, the n-type dopants are implanted to provide a carrier concentration of from about $10^{15}$ to about $10^{19}$ cm$^{-3}$. The n-type dopants may be implanted with implant energies of from about 10 to about 360 keV so as to provide the threshold adjustment region 20 that extends from a first surface of the first n-type silicon carbide layer 12 to a depth of from about 0.01 μm to about 0.5 μm into the first n-type silicon carbide layer 12. In certain embodiments of the present invention, the n-type implant is carried out at room temperature, however, higher temperatures may also be utilized. The threshold adjustment region 20 may be from about 2 μm to about 15 μm wide.

As illustrated in FIG. 21, after formation of the threshold adjustment region 20, the third mask 215 is removed and a fourth implantation mask 220 is formed by forming a second mask layer and patterning the second mask layer. The fourth implantation mask has a window 221 positioned between portions of the n$^+$ source region 14 to provide a p$^+$ plug implant that provides ohmic contact to the p-type buried regions 16.

Figure 2J:
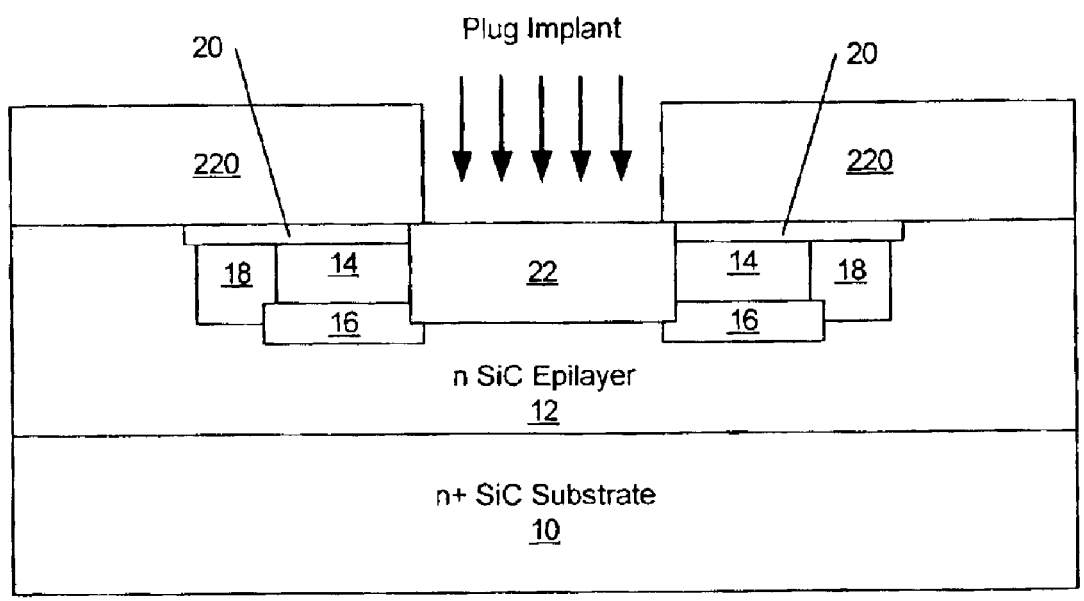

As seen in FIG. 2J, p-type dopants are implanted utilizing the window 221 of the fourth implantation mask 220 to provide the p$^+$ plug region 22. Suitable p-type dopants include, for example, Aluminum and Boron. In certain embodiments, the p-type dopants are implanted to provide a carrier concentration of from about $5\times10^{18}$ to about $1\times10^{21}$ cm$^-$. The concentration of p-type dopants may be uniform or non-uniform with depth. The p-type dopants may be implanted with one or more implant energies ranging from about 10 to about 360 keV so as to provide the p$^+$ plug region 22 that extends from the first surface of the first n-type silicon carbide layer 12 to a depth of from about 0.5 μm to about 1.2 μm into the first n-type silicon carbide layer 12. As seen in FIG. 2J, the p$^+$ plug region 22 extends to a depth sufficient to contact the p-type well region 16. In certain embodiments of the present invention, the p-type implant is carried out at room temperature, however, higher temperatures may also be utilized. The p$^+$ plug region 22 may be slightly wider than the window 221 as a result of implantation lateral straggle. Thus, for example, the p$^+$ plug region 22 may extend from about 0.2 μm to about 0.4 μm past the edge of the window 221 and have an overall width of from about 1 μm to about 20 μm.

Figure 2K:
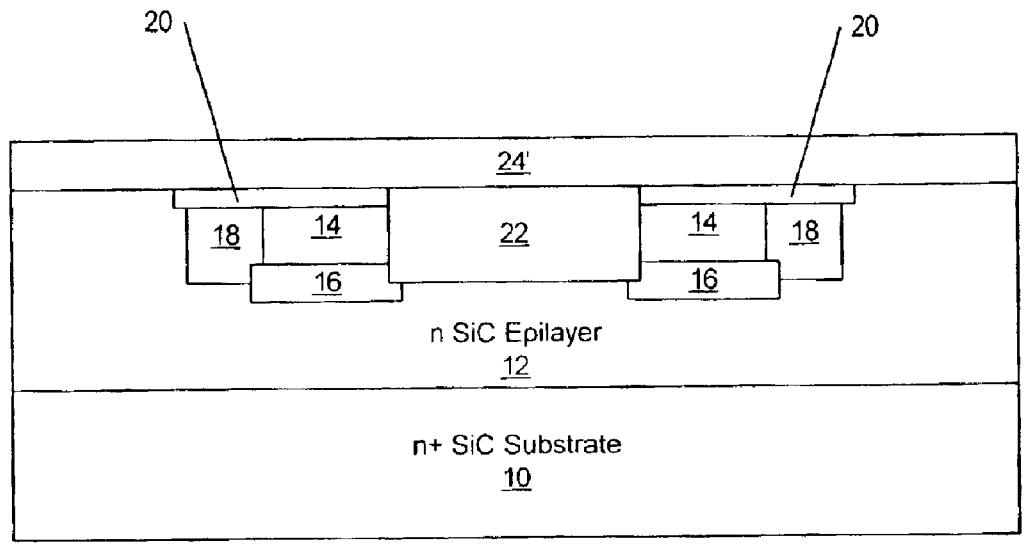

As illustrated in FIG. 2K, the fourth implantation mask is removed and the implants are activated by annealing the resulting structure. In certain embodiments of the present invention, the anneal is performed at a temperature of greater than about 1400° C. After the activation anneal, an oxide layer 24' is formed on the first surface of the first n-type silicon carbide layer 12 as illustrated in FIG. 2K. Optionally, the structure may be capped with a dielectric layer, such as SiO$_2$ or Si$_3$N$_4$, to protect the structure during annealing. Alternatively, in embodiments where the gate oxide is annealed after formation to improve the SiC/SiO$_2$ interface, the activation of such impurities may be provided by such anneal.

The oxide layer 24' may be formed by deposition, thermal growth or combinations thereof. In particular embodiments, the oxide layer 24' has a thickness of from about 200 to about 2000 Å. The oxide layer 24' may be single layer or multiple layers. In particular embodiments of the present invention, the oxide layer 24' is provided as a nitrided oxide and/or may be other oxides. The nitrided oxide may be any suitable gate oxide, however, in certain embodiments, SiO$_2$, oxynitride or ONO are utilized. Formation of the oxide layer 24' or the initial oxide of an ONO gate dielectric may be followed by an anneal in N$_2$O or NO so as to reduce defect density at the SiC/oxide interface. In particular embodiments, the oxide layer 24' is formed either by thermal growth or deposition and then annealed in an N$_2$O environment at a temperature of greater than about 1100° C. and flow rates of from about 2 to about 8 SLM which may provide initial residence times of the N$_2$O of from about 11 to about 45 seconds. Such formation and annealing of an oxide layer on silicon carbide are described in commonly assigned U.S. patent application Ser. No. 09/834,283, entitled "METHOD OF N$_2$O ANNEALING AN OXIDE LAYER ON A SILICON CARBIDE LAYER", U.S. Provisional Application Serial No. 60/237,822 entitled "Method of N$_2$O Growth of an oxide layer on a Silicon Carbide Layer" filed May 30, 2001, U.S. patent application Ser. No. 09/968,391 entitled "METHOD OF N$_2$O GROWTH OF AN OXIDE ON A SILICON CARBIDE LAYER" filed Oct. 1, 2001, and/or U.S. patent application Ser. No. 10/045,542 entitled "METHOD OF FABRICATING AN OXIDE LAYER ON A SILICON CARBIDE LAYER UTILIZING AN ANNEAL IN A HYDROGEN ENVIRONMENT" filed Oct. 26, 2001, the disclosures of which are incorporated herein by reference as if set forth fully herein.

Additionally, an N$_2$O grown oxide may also be utilized as described in J. P. Xu, P. T. Lai, C. L. Chan, B. Li, and Y. C. Cheng, "Improved Performance and Reliability of N$_2$O-Grown Oxynitride on 6H—SiC," IEEE Electron Device Letters, Vol. 21, No. 6, pp. 298–300, June 2000. Techniques as described in L. A. Lipkin and J. W. Palmour, "Low interface state density oxides on p-type SiC," Materials Science Forum Vols. 264–268, pp. 853–856, 1998 may also be utilized. Alternatively, for thermally grown oxides, a subsequent NO anneal of the thermally grown SiO$_2$ layer may be provided to reduce the interface trap density as is described in M. K. Das, L. A. Lipkin, J. W. Palmour, G. Y. Chung, J. R. Williams, K. McDonald, and L. C. Feldman, "High Mobility 4H—SiC Inversion Mode MOSFETs Using Thermally Grown, NO Annealed SiO$_2$," IEEE Device Research Conference, Denver, Colo., Jun. 19–21, 2000; G. Y. Chung, C. C. Tin, J. R. Williams, K. McDonald, R. A. Weller, S. T. Pantelides, L. C. Feldman, M. K. Das, and J. W. Palmour, "Improved Inversion Channel Mobility for 4H—SiC MOSFETs Following High Temperature Anneals in Nitric Oxide," IEEE Electron Device Letters accepted for publication; and G. Y. Chung, C. C. Tin, J. R. Williams, K. McDonald, M. Di Ventra, S. T. Pantelides, L. C. Feldman, and R. A. Weller, "Effect of nitric oxide annealing on the interface trap densities near the band edges in the 4H polytype of silicon carbide," Applied Physics Letters, Vol. 76, No. 13, pp. 1713–1715, March 2000. Oxynitrides may be provided as described in U.S. patent application Ser. No. 09/878,442, entitled "HIGH VOLTAGE, HIGH TEMPERATURE CAPACITOR STRUCTURES AND METHODS OF FABRICATION" filed Jun. 11, 2001, the disclosure of which is incorporated herein by reference as if set forth fully herein.

Figure 2L:
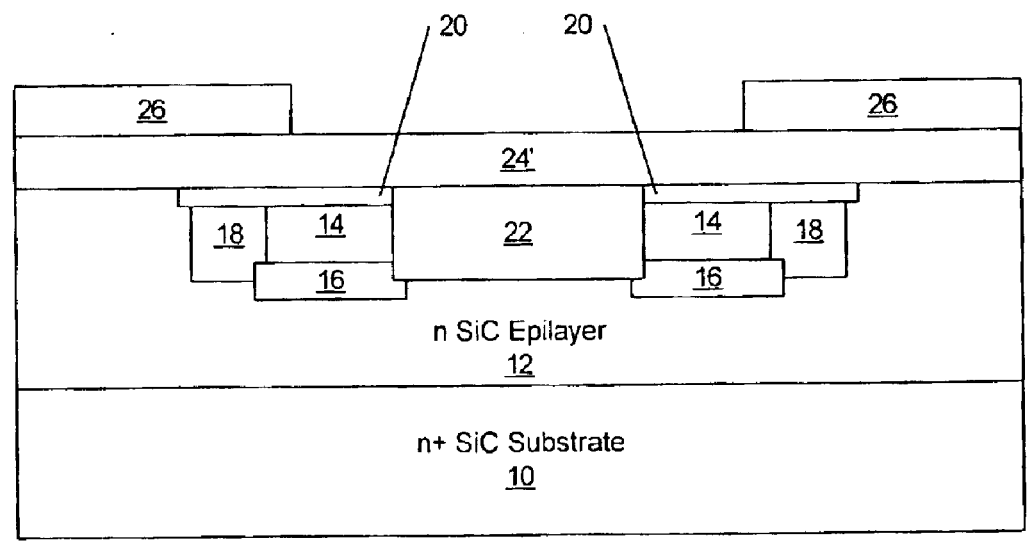

FIG. 2L illustrates formation of the gate contact 26. The gate contact 26 may be p-type polysilicon doped with phosphorous or boron and deposited using low pressure chemical vapor deposition (LPCVD) and/or may be other suitable contact material, such as tungsten or molybdenum, and may be formed and patterned utilizing techniques known to those of skill in the art. Alternatively, the oxide layer 24' of FIG. 2L and the gate contact 26 may be formed and patterned together to provide an opening for a source contact 28 and to provide the gate oxide 24 illustrated in FIG. 2M.

Figure 2M:
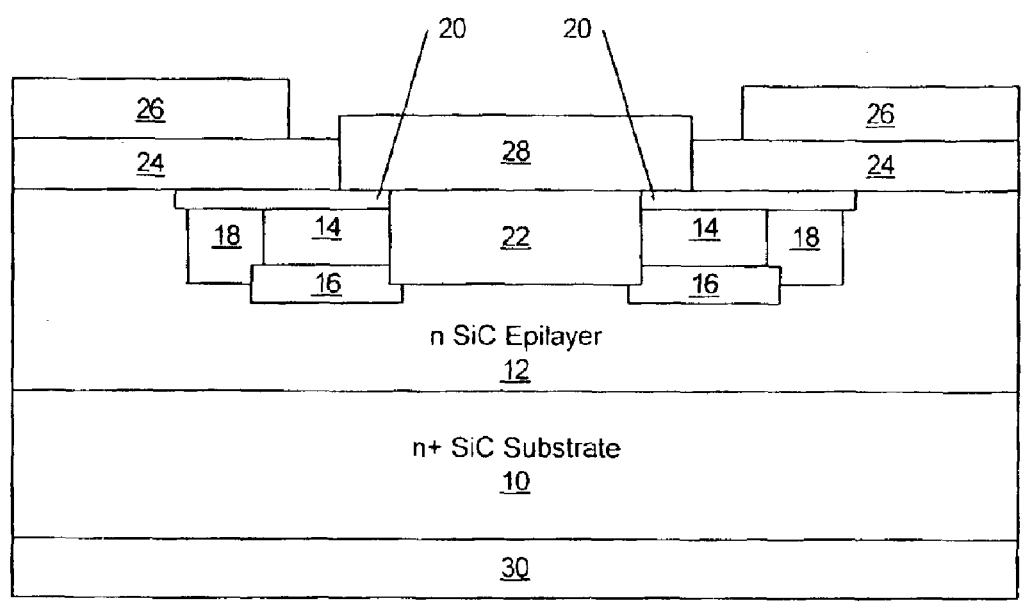

As seen in FIG. 2M, the oxide layer 24' is patterned to provide the gate oxide 24. A window is opened in the oxide layer 24' to expose the p$^+$ plug region 22 and portions of the threshold adjustment region 20. A contact metal is deposited in the window to provide an ohmic source contact 28. A contact metal is also deposited on a face to the second n-type layer 10 opposite the first n-type silicon carbide layer 12 to provide a drain contact 30. In particular embodiments of the present invention the contact metal of the source contact 28 and/or the drain contact 30 are formed of nickel (Ni), titanium (Ti), platinum (Pt) or aluminum (Al), chromium (Cr), combinations thereof, Such as Ti/Ni, Al/Ni or Cr/Ni stacks, alloys thereof, such as NiCr, and/or other suitable contact materials and may be annealed at temperatures of from about 600° C. to about 1100° C., for example, 825° C., so as to provide an ohmic contact. The source and drain contacts 28 and 30 may have a thickness of from about 150 to about 3000 Å. The source contact 28 an/or drain contact 30 may be formed by evaporative deposition, sputtering or other such techniques known to those of skill in the art.

As illustrated in FIG. 2M, a semiconductor device according to certain embodiments of the present invention includes a first silicon carbide layer 12 having a first conductivity type. A source region 14 is provided in the first silicon carbide layer 12 and has the first conductivity type. The source region 14 has a higher carrier concentration than a carrier concentration of the first silicon carbide layer 12 and extends to a first surface of the first silicon carbide layer 12. The source region 14 may have dopants of the first conductivity type and dopants of a second conductivity type opposite the first conductivity type. A buried region 16 of silicon carbide of the second conductivity type is provided in the first silicon carbide layer 12 adjacent a bottom portion of the source region 14 and at a depth in the first silicon carbide layer 12 greater than a depth of the source region 14. A well region 18 of silicon carbide of the second conductivity type is provided in the first silicon carbide layer adjacent an outside portion of the source region 14 and extending toward the first surface of the first silicon carbide layer 12. The well region 18 has a lower carrier concentration than a carrier concentration of the buried region 16. A plug region 22 of silicon carbide of the second conductivity type is adjacent an inside portion of the source region 14 opposite the well region 18 and extending to the first face of the first silicon carbide layer 12. A gate oxide 24 is on the first silicon carbide layer 12, the well region 18 and the source region 14. A gate contact 26 is on the gate oxide 24. A source contact 28 is on the plug region 22 and the source region 14. A drain contact 30 is on the first silicon carbide layer 12 opposite the first surface of the first silicon carbide layer 12.

As is further illustrated in FIG. 2M, a threshold adjustment region 20 of first conductivity type silicon carbide is provided in the first silicon carbide layer 12 and extends from the source region 14. The threshold adjustment region 20 is disposed between the well region 18 and the first face of the first layer of silicon carbide 12.

Referring now to FIGS. 3A–3G, methods of fabricating a silicon carbide power MOSFET according to further embodiments of the present invention will now be described. The embodiments of the present invention illustrated in FIGS. 3A–3G have an n-type epitaxial layer rather than the threshold adjustment regions 20 of the embodiments illustrated in FIGS. 2A–2M. The initial steps in the fabrication of MOSFETs as illustrated in FIGS. 3A–3G are the same as illustrated in FIGS. 1A–2E. However, after the implantation illustrated in FIG. 2E, the second implantation mask 210 is removed.

Figure 3A:
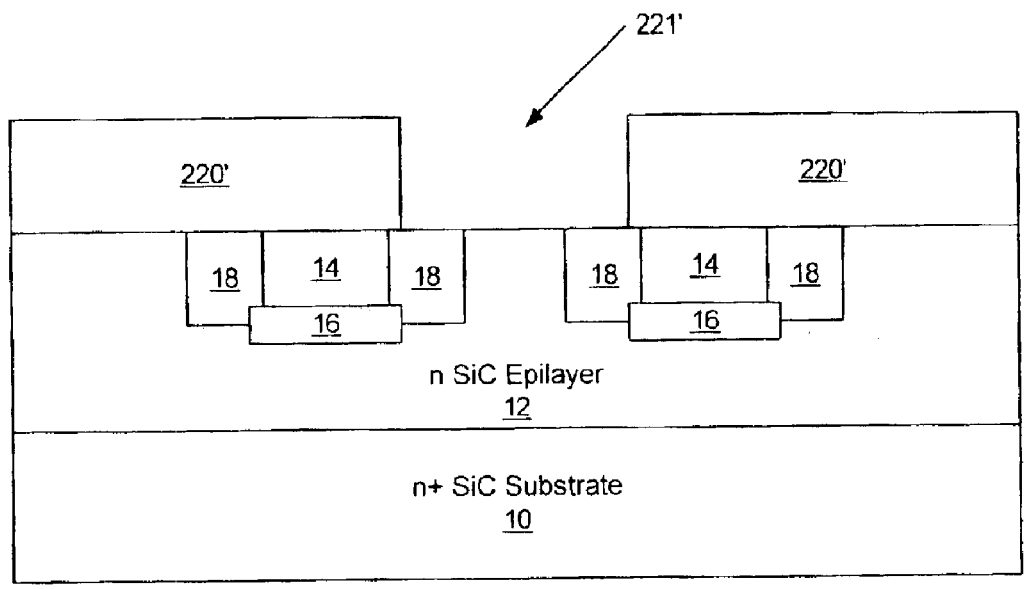
FIGS. 3A–3G are cross-sectional views of illustrating methods of fabrication of MOSFETs according to additional embodiments of the present invention.
Figure 3B:
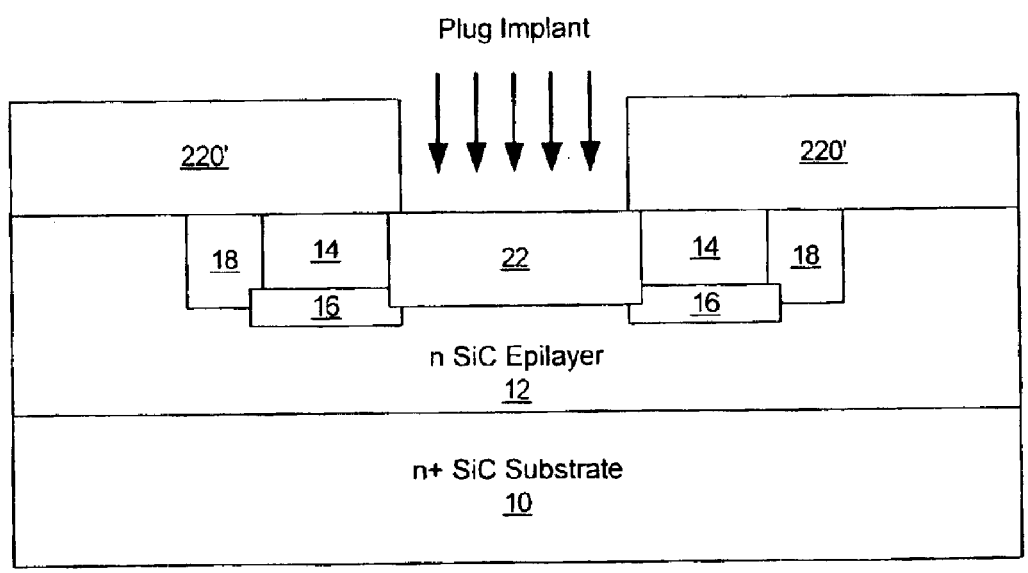

As illustrated in FIG. 3A, after removal of the second implantation mask 210, a third implantation mask 220' is formed by forming a second mask layer and patterning the second mask layer as described above with reference to the fourth implantation in ask 220. The third implantation mask 220' has a window 221' positioned between portions of the n$^+$ source region 14 to provide a p$^+$ plug implant that provides ohmic contact to the p-type buried regions 16. As seen in FIG. 3B, p-type dopants are implanted utilizing the window 221' of the third implantation mask 220' to provide the p$^+$ plug region 22 as described above with reference to FIG. 3B.

Figure 3C:
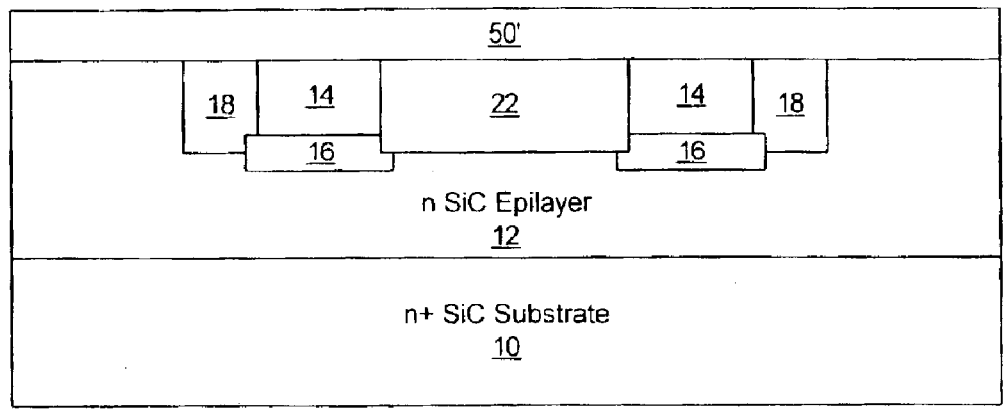

As seen in FIG. 3C, after removal of the third mask 220' and activation of the implants as describe above, an n-type silicon carbide channel epitaxial layer 50' is formed on the first surface of the first n-type silicon carbide layer 12. The charge in the channel epitaxial layer 50' may be close to that of the threshold adjustment region 20 described above. In particular embodiments of the present invention, the channel epitaxial layer 50' has a carrier concentration of from about $10^{15}$ to about $10^{17}$ cm$^{-3}$ and has a thickness of from about 0.05 μm to about 1 μm.

Figure 3D:
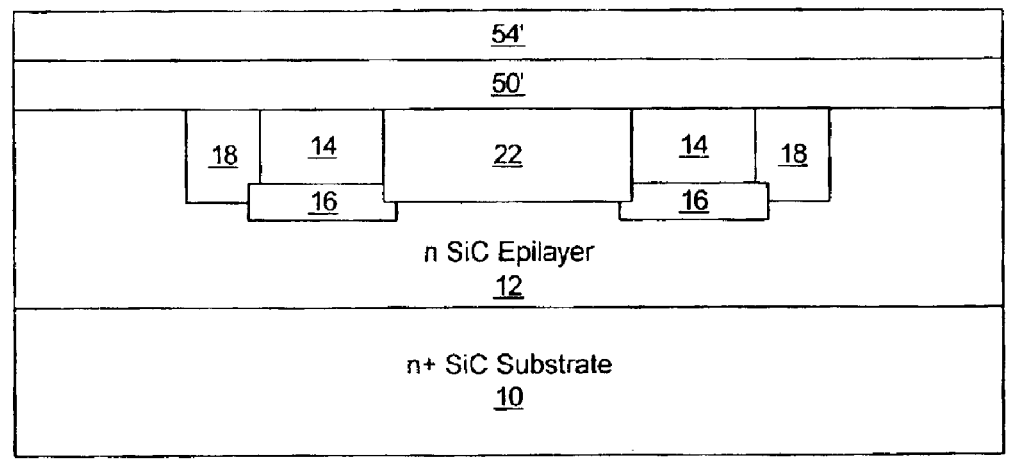

As is illustrated in FIG. 3D, an oxide layer 54' is formed oil the channel epitaxial layer 50'. The oxide layer 54' may be formed as described above with reference to the oxide layer 24'.

Figure 3E:
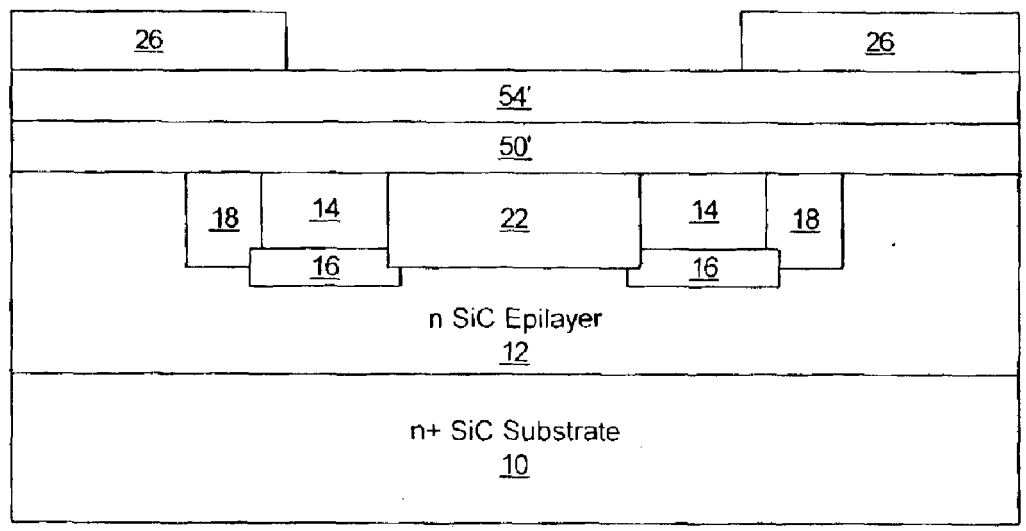
Figure 3F:
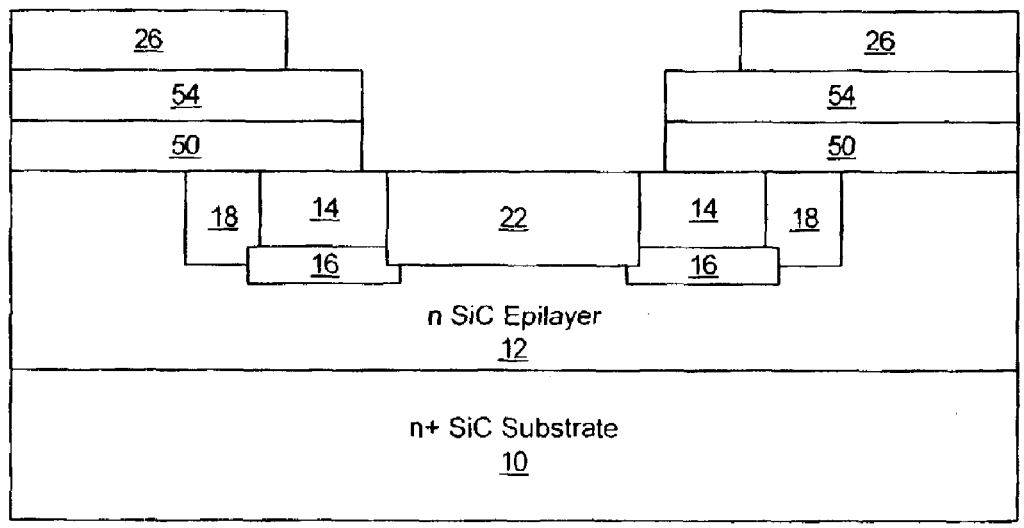
Figure 3G:
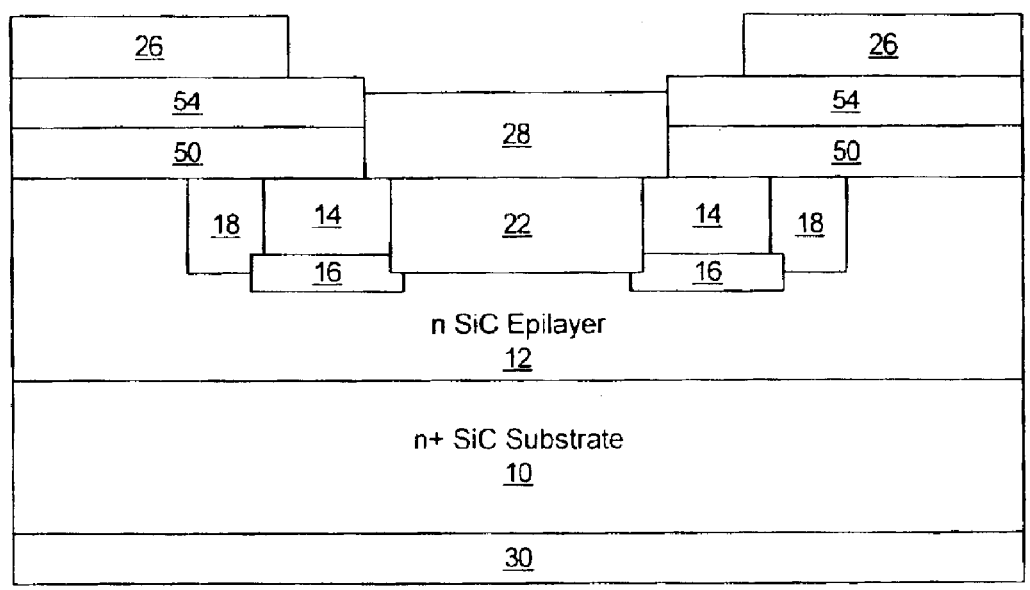

FIG. 3E illustrates the formation of the gate contact 26. The gate contact 26 may be formed as described above with reference to FIG. 2L. FIG. 3F illustrates the patterning of the channel epitaxial layer 50' and the oxide layer 54' to provide channel regions 50 and gate oxide 54. A window is opened in the oxide layer 54' and the channel epitaxial layer 50' to expose the p$^+$ plug region 22 and portions of the n$^+$ source region 14. As illustrated in FIG. 3G, a contact metal is deposited in the window to provide an ohmic source contact 28. A contact metal is also deposited on a face to the second n-type layer 10 opposite the first n-type silicon carbide layer 12 to provide a drain contact 30. Thus, as illustrated in FIG. 3G, the silicon carbide semiconductor device of FIG. 2M may have the threshold adjustment region 20 replaced by the channel region 50.

Figure 4A:
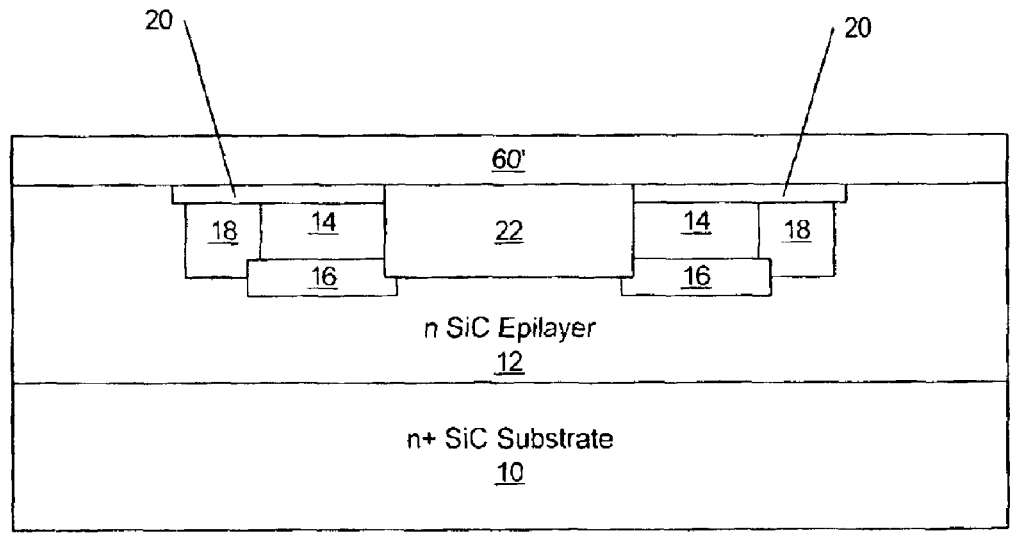
FIGS. 4A–4E are cross-sectional views of illustrating methods of fabrication of MOSFETs according to embodiments of the present invention.

Referring now to FIGS. 4A–4E, methods of fabricating a silicon carbide power MOSFET according to further embodiments of the present invention will now be described. The embodiments of the present invention illustrated in FIGS. 4A–4E have an n-type epitaxial layer and the threshold adjustment regions 20 of the embodiments illustrated in FIGS. 2A–2M and 3A–3G. The initial steps in the fabrication of MOSFETs as illustrated in FIGS. 4A–4E are the same as illustrated in FIGS. 2A–2J. However, prior to formation of the oxide layer 24' and after illustrated in FIG. 2K and after implant activation, an n-type silicon carbide epitaxial layer 60' is formed as illustrated in FIG. 4A. As seen in FIG. 4A, after activation of the implants as describe above, an n-type silicon carbide channel epitaxial layer 60' is formed on the first surface of the first n-type silicon carbide layer 12. The charge in the channel epitaxial layer 60' may be less than and, in some embodiments, much less than that of the threshold adjustment region 20 described above. In particular embodiments of the present invention, the channel epitaxial layer 60' has a carrier concentration of from about $10^{14}$ to about $10^{16}$ cm$^{-3}$ and has a thickness of from about 0.05 µm to about 1 µm.

Figure 4B:
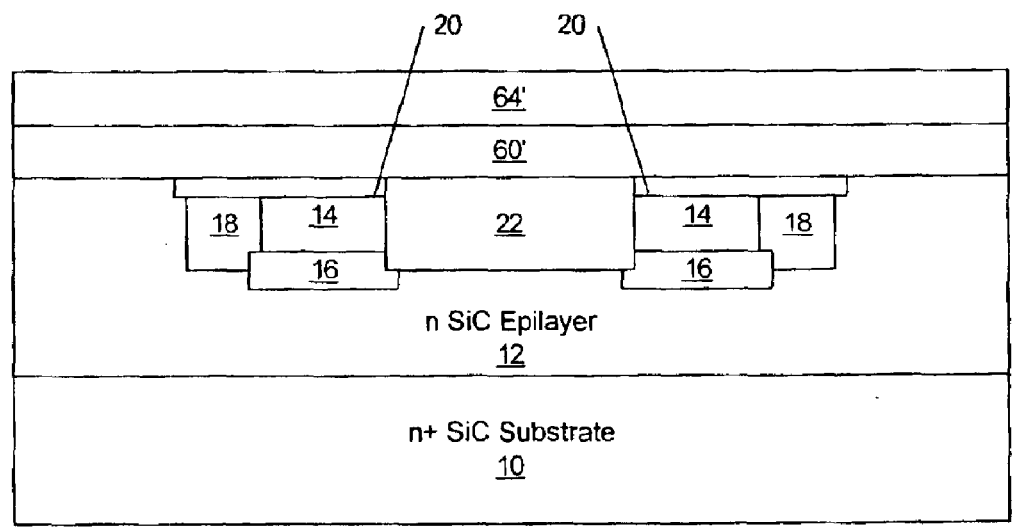

As is illustrated in FIG. 4B, an oxide layer 64' is formed on the channel epitaxial, layer 60'. The oxide layer 64' may be formed as described above with reference to the oxide layer 24'.

Figure 4C:
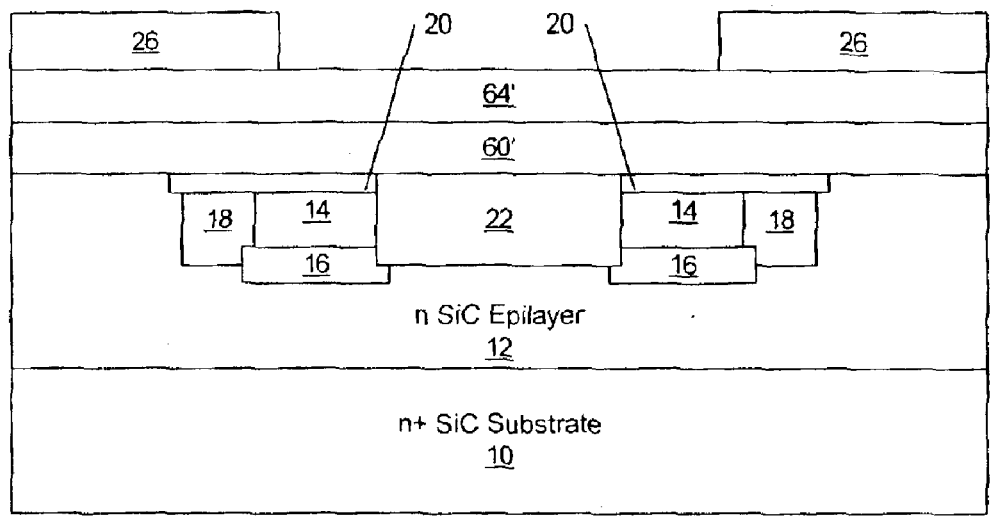
Figure 4D:
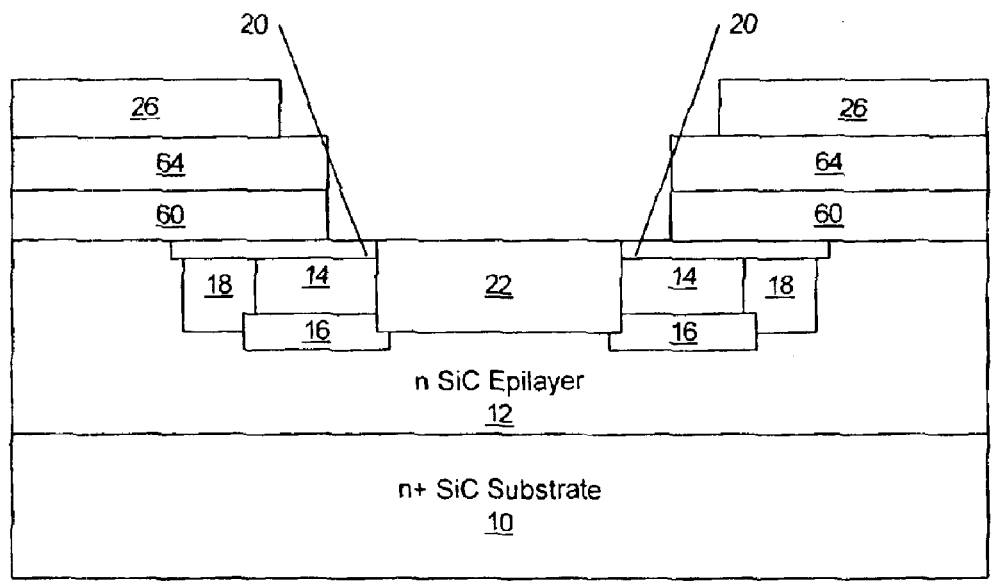
Figure 4E:
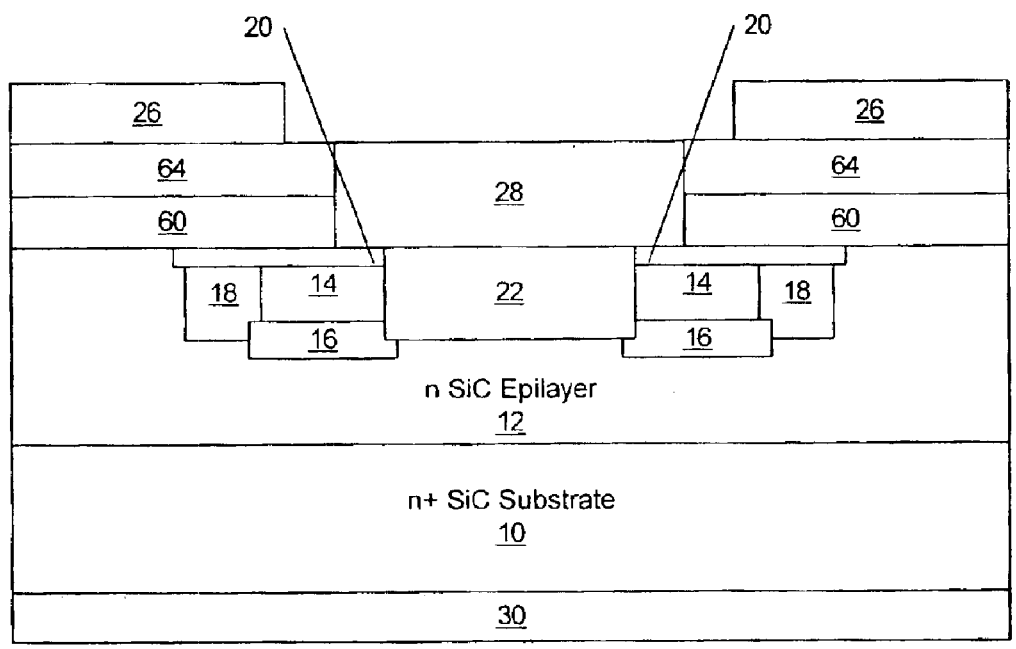

FIG. 4C illustrates the formation of the gate contact 26. The gate contact 26 may be formed as described above with reference to FIG. 2L. FIG. 4D illustrates the patterning of the channel epitaxial layer 64' and the oxide layer 60' to provide channel regions 60 and gate oxide 64. A window is opened in the oxide layer 64' and the channel epitaxial layer 60' to expose the p$^+$ plug region 22 and portions of the threshold adjustment region 20. As illustrated in FIG. 4E, a contact metal is deposited in the window to provide an ohmic source contact 28. A contact metal is also deposited on a face to the second n-type layer 10 opposite the first n-type silicon carbide layer 12 to provide a drain contact 30. Thus, as illustrated in FIG. 3G, the silicon carbide semiconductor device of FIG. 2M may have both a threshold adjustment region 20 and a channel region 60.

While FIGS. 2M, 3G and 4E illustrate embodiments of the present invention as a discrete device, as will be appreciated by those of skill in the art, FIGS. 2M, 3G and 4E may be considered unit cells of a device having multiple cells. Thus, for example, additional unit cells may be incorporated into the devices illustrated in 2M, 3G and 4E by dividing the devices along their central axis (illustrated as the vertical axis in FIGS. 2M, 3G and 4E) and rotating the divided device about an axis of the periphery of the devices illustrated in FIGS. 2M, 3G and 4E (the vertical edges of the devices illustrated in FIGS. 2M, 3G and 4E). Accordingly, embodiments of the present invention include devices such as those illustrated in FIGS. 2M, 3G and 4E as well as devices having a plurality of unit cells incorporating the implanted regions illustrated in FIGS. 2M, 3G and 4E.

While embodiments of the present invention have been described with reference to particular sequences of operations, as will be appreciated by those of skill in the art, certain operations within the sequence may be reordered while still benefiting from the teachings of the present invention. For example, in particular embodiments of the present invention, the formation of the oxide layer 54' may be performed after patterning of the channel epitaxial layer 50'. Accordingly, the present invention should not be construed as limited to the exact sequence of operations described herein.

Furthermore, embodiments of the present invention have been described with reference to an n-type SiC layer and p-type silicon carbide well and buried layers. However, embodiments of the present invention may also provide complementary structures with corresponding modifications of the methods of fabrication described herein.

As described above, embodiments of the present invention may allow for the fabrication of very small gate lengths as the gate length is defined by the etching of the mask that forms the source region and the well region. Thus, a relatively low total on resistance of the resulting SiC MOSFETs may be provided as the MOS channel resistance may be the dominant resistance in device. Furthermore, photolithography steps may be eliminated through the use of the mask thus, potentially, reducing processing time and cost compared to a conventional fabrication process.

Furthermore, in embodiments of the present invention incorporating the epitaxial channel layer, if the gate oxide is formed by thermal oxidation, the n$^+$ source regions are not oxidized. Accordingly, the resulting structures may not have porous, less reliable oxides that may result from growing oxides on n$^+$ implanted regions. Such embodiments may also provide a continuous channel from the n$^+$ source regions through the MOS gate regions to the drain area.

In the drawings and specification, there have been disclosed typical preferred embodiments of the invention and, although specific terms are employed, they are used in a generic and descriptive sense oily and not for purposes of limitation, the scope of the invention being set forth in the following claims.

What is claimed is:

1. A method of fabricating a silicon carbide power device comprising:
   successively patterning a single mask layer to provide a first window for formation of a source region of a first conductivity type and a buried silicon carbide region of a second conductivity type opposite the first conductivity type and a second window for formation of a second conductivity type well region in a first conductivity type silicon carbide layer.

2. The method of claim 1, further comprising:
   forming the source region and the buried silicon carbide region utilizing a first window of the single mask layer; and then
   forming the well region utilizing a second window of the mask layer, the second window being provided by a subsequent patterning of the single mask layer having the first window.

3. The method of claim 1, wherein the first conductivity type is n-type silicon carbide and the second conductivity type is p-type silicon carbide and wherein the buried silicon carbide region comprises a buried p-type silicon carbide region and the well region comprises a p-well region.

4. A method of fabricating a silicon carbide power device comprising:
   successively patterning a mask layer to provide windows for formation of a source region of a first conductivity type, a buried silicon carbide region of a second conductivity type opposite the first conductivity type and a second conductivity type well region in a first conductivity type silicon carbide layer;
   wherein the first conductivity type is n-type silicon carbide and the second conductivity type is p-type silicon carbide and wherein the buried silicon carbide region comprises a buried p-type silicon carbide region and the well region comprises a p-well region; and wherein successively patterning a mask layer, forming the source region and the buried p-type silicon carbide region and forming the p-well region comprise:

forming the mask layer on a first surface of the first n-type silicon carbide layer;

patterning the mask layer to provide a first implantation mask, the first implantation mask having at least one window corresponding to the source region of the silicon carbide power device; then implanting n-type dopants in the first n-type silicon carbide layer utilizing the first implantation mask having the at least one window to provide an n-type source region, the n-type source region extending to the first surface of the first n-type silicon carbide layer and having a higher carrier concentration than the first n-type silicon carbide layer;

implanting p-type dopants in the first n-type silicon carbide layer utilizing the first implantation mask having the at least one window to provide the buried p-type region adjacent the n-type source region, the buried p-type region being disposed at a depth in the first n-type silicon carbide layer greater than a depth of the n-type source region; then etching the first implantation mask to provide a second implantation mask, the second implantation mask having at least one window corresponding to the p-well region and corresponding to the at least one window of the first implantation mask widened by the etch; and then implanting p-type dopants in the first n-type silicon carbide layer utilizing the second implantation mask to provide the p-well region, the p-well region extending to the p-type buried region.

5. A method of fabricating a silicon carbide power device comprising:

successively patterning a mask layer to provide a first window for formation of a source region of a first conductivity type and buried silicon carbide region of a second conductivity type opposite the first conductivity type and a second window for formation of a second conductivity type well region in a first conductivity type silicon carbide layer;

wherein the first conductivity type is n-type silicon carbide and the second conductivity type is p-type silicon carbide and wherein the buried silicon carbide region comprises a buried p-type silicon carbide region and the well region comprises a p-well region; and wherein successively patterning a mask layer to provide windows for formation of a source region, a buried p-type silicon carbide region and a p-well region comprises successively patterning a mask layer to provide windows for formation of a source region, a buried p-type silicon carbide region, a p-well region and a threshold adjustment region in a first n-type silicon carbide layer, the method further comprising forming the threshold adjustment region utilizing a third window of the mask layer, the third window being provided by a subsequent etch of the mask layer having the second window.

6. A method of fabricating a silicon carbide power device comprising:

successively patterning a mask layer to provide windows for formation of a source region of a first conductivity type, a buried silicon carbide region of a second conductivity type opposite the first conductivity type and a second conductivity type well region in a first conductivity type silicon carbide layer;

wherein the first conductivity type is n-type silicon carbide and the second conductivity type is p-type silicon carbide and wherein the buried silicon carbide region comprises a buried p-type silicon carbide region and the well region comprises a p-well region; and wherein successively patterning a mask layer, forming the source region and the buried p-type silicon carbide region and forming the p-well region comprise:

forming the mask layer on a first n-type silicon carbide layer;

patterning the mask layer to provide a first implantation mask, the first implantation mask having at least one window corresponding to the source region of the silicon carbide power device; then implanting n-type dopants in the first n-type silicon carbide layer utilizing the first implantation mask having the at least one window to provide an n-type source region, the n-type source region extending to a first surface of the first n-type silicon carbide layer and having a higher carrier concentration than the first n-type silicon carbide layer;

implanting p-type dopants in the first n-type silicon carbide layer utilizing the first implantation mask having the at least one window to provide the buried p-type region adjacent the n-type source region, the p-type dopants being implanted utilizing a higher implantation energy than an implant energy utilized to implant the n-type dopants in the first n-type silicon carbide layer utilizing the first implantation mask to provide an n-type source region; then etching the first implantation mask to provide a second implantation mask, the second implantation mask having at least one window corresponding to the p-well region and corresponding to the at least one window of the first implantation mask widened by the etch; and then implanting p-type dopants in the first n-type silicon carbide layer utilizing the second implantation mask to provide the p-well region, the p-type dopants being implanted utilizing an implantation energy such that the p-well region extends to the p-type buried region.

7. The method of claim 6, wherein implanting p-type dopants in the first n-type silicon carbide layer utilizing the second implantation mask to provide the p-well region comprises implanting p-type dopants in the first n-type silicon carbide layer utilizing the second implantation mask to provide a carrier concentration of the p-well region that is less than a carrier concentration of the buried p-type silicon carbide layer.

8. The method of claim 6, wherein implanting p-type dopants in the first n-type silicon carbide layer utilizing the second implantation mask to provide the p-well region is followed by:

etching the second implantation mask to provide a third implantation mask, the third implantation mask having at least one window corresponding to a threshold adjustment region and corresponding to the at least one window of the second implantation mask widened by the etch; and then implanting n-type dopants in the first n-type silicon carbide layer utilizing the third implantation mask to provide the threshold adjustment region.

9. The method of claim 8, wherein implanting n-type dopants in the first n-type silicon carbide layer utilizing the third implantation mask to provide the threshold adjustment region comprises implanting n-type dopants in the first n-type silicon carbide layer utilizing the third implantation mask to a depth of from about 0.01 to about 0.5 µm into the first n-type silicon carbide layer.

10. The method of claim 8, further comprising:

removing the third implantation mask;

forming a fourth implantation mask, the fourth implantation mask patterned to provide a window exposing the first surface of the first n-type silicon carbide layer inside the source region;

implanting p-type dopants utilizing the fourth implantation mask to provide a p-type silicon carbide plug region, the plug region extending into the first n-type silicon carbide layer to contact the p-type buried region;

forming a gate oxide on the first surface of the first n-type silicon carbide layer;

forming a gate contact on the gate oxide;

forming a source contact on the source region and the plug region and forming a drain contact on the first n-type silicon carbide layer opposite the first surface.

11. The method of claim 10, further comprising forming a second n-type silicon carbide layer on a surface of the first n-type silicon carbide layer opposite the first surface, the second n-type silicon carbide layer having a carrier concentration higher than a carrier concentration of the first n-type silicon carbide layer.

12. The method of claim 8, wherein implanting n-type dopants in the first n-type silicon carbide layer utilizing the third implantation mask to provide the threshold adjustment region is followed by:

removing the third implantation mask; and forming an n-type silicon carbide epitaxial layer on the first surface of the first n-type silicon carbide layer.

13. The method of claim 12, wherein forming an n-type silicon carbide epitaxial layer is preceded by the steps of:

forming a fourth implantation mask, the fourth implantation mask patterned to provide a window exposing a portion of the n-type silicon carbide epitaxial layer inside the source region;

implanting p-type dopants utilizing the fourth implantation mask to provide a p-type silicon carbide plug region, the plug region extending into the first n-type silicon carbide layer to contact the p-type buried region; and activating the implanted dopants; and wherein forming an n-type silicon carbide epitaxial layer is followed by the steps of:

forming a gate oxide on n-type silicon carbide epitaxial layer;

forming a gate contact on the gate oxide;

forming a source contact on the source region and the plug region; and forming a drain contact on the first n-type silicon carbide layer opposite the first surface.

14. The method of claim 13, further comprising forming a second n-type silicon carbide layer on a surface of the first n-type silicon carbide layer apposite the first surface, the second n-type silicon carbide layer having a carrier concentration higher than a carrier concentration of the first n-type silicon carbide layer.

15. The method of claim 6, wherein implanting p-type dopants in the first n-type silicon carbide layer utilizing the second implantation mask to provide the p-well region is followed by:

removing the second implantation mask; and forming an n-type silicon carbide epitaxial layer on the first surface of the first n-type silicon carbide layer.

16. The method of claim 15, wherein forming an n-type silicon carbide epitaxial layer is preceded by the steps of:

forming a third implantation mask, the third implantation mask patterned to provide a window exposing a portion of the n-type silicon carbide epitaxial layer inside the source region;

implanting p-type dopants utilizing the third implantation mask to provide a p-type silicon carbide plug region, the plug region extending into the first n-type silicon carbide layer to contact the p-type buried region; and activating the implanted dopants; and wherein forming an n-type silicon carbide epitaxial layer is followed by the steps of:

forming a gate oxide on n-type silicon carbide epitaxial layer;

forming a gate contact on the gate oxide;

forming a source contact on the source region and the plug region; and forming a drain contact on the first n-type silicon carbide layer opposite the first surface.

17. The method of claim 16, further comprising forming a second n-type silicon carbide layer on a surface of the first n-type silicon carbide layer opposite the first surface, the second n-type silicon carbide layer having a carrier concentration higher than a carrier concentration of the first n-type silicon carbide layer.

* * * * *

UNITED STATES PATENT AND TRADEMARK OFFICE
CERTIFICATE OF CORRECTION

| | |
|---|---|
| PATENT NO. | : 7,074,643 B2 |
| APPLICATION NO. | : 10/422130 |
| DATED | : July 11, 2006 |
| INVENTOR(S) | : Ryu |

Page 1 of 1

It is certified that error appears in the above-identified patent and that said Letters Patent is hereby corrected as shown below:

<u>Column 17,</u>
Line 41 should read -- conductivity type and a buried silicon carbide region of --

<u>Column 20,</u>
Line 13 should read -- n-type silicon carbide layer opposite the first surface, the --

Signed and Sealed this

Twelfth Day of December, 2006

JON W. DUDAS
*Director of the United States Patent and Trademark Office*